US012812863B2

(12) United States Patent
Choi

(10) Patent No.: US 12,812,863 B2
(45) Date of Patent: Nov. 24, 2026

(54) INTEGRATED CIRCUIT DEVICE AND ELECTRONIC SYSTEM INCLUDING THE SAME

(71) Applicant: Samsung Electronics Co., Ltd., Suwon-si (KR)

(72) Inventor: Hyunmook Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 279 days.

(21) Appl. No.: 18/660,799

(22) Filed: May 10, 2024

(65) Prior Publication Data

US 2024/0389325 A1 Nov. 21, 2024

(30) Foreign Application Priority Data

May 15, 2023 (KR) ........................ 10-2023-0062693

(51) Int. Cl.

| | |
|---|---|
| ***H10B 43/27*** | (2023.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |
| ***H10B 80/00*** | (2026.01) |
| ***H10W 20/41*** | (2026.01) |
| ***H10W 90/00*** | (2026.01) |

(52) U.S. Cl.

CPC ......... *H10B 43/27* (2023.02); *G11C 16/0483* (2013.01); *H10B 41/10* (2023.02); *H10B 41/27* (2023.02); *H10B 41/35* (2023.02); *H10B 43/10* (2023.02); *H10B 43/35* (2023.02); *H10B 80/00* (2023.02); *H10W 20/435* (2026.01); *H10W 90/00* (2026.01); *H10W 90/752* (2026.01)

(58) Field of Classification Search

CPC ........ H10B 43/27; H10B 41/10; H10B 41/27; G11C 16/0483

See application file for complete search history.

(56) References Cited

U.S. PATENT DOCUMENTS

| | | | |
|---|---|---|---|
| 10,475,804 | B1 | 11/2019 | Nishikawa et al. |
| 10,833,096 | B2 | 11/2020 | Tanaka et al. |
| 10,930,670 | B2 | 2/2021 | Shin et al. |

(Continued)

*Primary Examiner* — Erik Kielin

(74) *Attorney, Agent, or Firm* — Wolf, Greenfield & Sacks, P.C.

(57) ABSTRACT

An integrated circuit device includes a semiconductor substrate, a gate stack including a plurality of gate layers and a plurality of insulating layers that are alternately stacked on the semiconductor substrate, a plurality of channel structures extending through the gate stack in a first direction, a word line cut extending through the gate stack in the first direction, a string selection line stack on the gate stack, and a plurality of gate structures extending through the string selection line stack in the first direction, the plurality of gate structures completely overlapping the plurality of channel structures corresponding thereto in the first direction, wherein an air gap is between two gate structures, which are adjacent to each other in an oblique direction relative to the first direction, from among the plurality of gate structures.

20 Claims, 27 Drawing Sheets

(56) References Cited

U.S. PATENT DOCUMENTS

| | | | | |
|---|---|---|---|---|
| 2009/0179257 | A1* | 7/2009 | Komori | H10B 41/27 |
| | | | | 257/E21.546 |
| 2020/0098780 | A1* | 3/2020 | Cui | H10B 41/10 |
| 2022/0367485 | A1 | 11/2022 | Park et al. | |
| 2023/0014037 | A1 | 1/2023 | Jung et al. | |
| 2023/0024655 | A1 | 1/2023 | Lee et al. | |
| 2023/0041326 | A1 | 2/2023 | Clampitt et al. | |

* cited by examiner

300

D-D'

INTEGRATED CIRCUIT DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2023-0062693, filed on May 15, 2023, in the Korean Intellectual Property Office, the disclosure of which is incorporated by reference herein in its entirety.

BACKGROUND

The inventive concept relates to an integrated circuit (IC) device and an electronic system including the IC device, and more particularly, to an IC device including a non-volatile vertical memory device and an electronic system including the IC device.

To improve performance and economical efficiency, increasing the integration density of IC devices may be required. In particular, the integration density of memory devices may significantly affect the economical efficiency of products. Because the integration density of a two-dimensional (2D) memory device is mainly determined by an area occupied by a unit memory cell, the integration density of a 2D memory device may be affected by levels of techniques of forming fine patterns. However, expensive equipment may be required for formation of fine patterns. Also, because an area of a chip die is limited, the integration density of a 2D memory device is generally increasing but may be still limited. Accordingly, a vertical memory device having a three-dimensional (3D) structure may be used for some applications.

SUMMARY

Embodiments of the inventive concept may provide an integrated circuit (IC) device, which may simplify a manufacturing process and efficiently improve a process margin in a vertical memory device having a three-dimensional (3D) structure, and an electronic system including the IC device.

Aspects of the inventive concept should not be limited by the above description, and other unmentioned aspects will be clearly understood by one of ordinary skill in the art from embodiments described herein.

According to an aspect of the inventive concept, there is provided an IC device including a semiconductor substrate, a gate stack including a plurality of gate layers and a plurality of insulating layers, the plurality of gate layers and the plurality of insulating layers being alternately stacked on the semiconductor substrate, a plurality of channel structures extending through the gate stack in a first direction, a word line cut extending through the gate stack in the first direction, a string selection line stack on the gate stack, and a plurality of gate structures extending through the string selection line stack in the first direction, the plurality of gate structures completely overlapping the plurality of channel structures corresponding thereto in the first direction, wherein an air gap is between two gate structures, which are adjacent to each other in an oblique direction relative to the first direction, from among the plurality of gate structures.

According to another aspect of the inventive concept, there is provided an IC device including a semiconductor substrate, a gate stack including a plurality of gate layers and a plurality of insulating layers, the plurality of gate layers and the plurality of insulating layers being alternately stacked on the semiconductor substrate, a plurality of channel structures extending through the gate stack in a first direction, a word line cut extending through the gate stack in the first direction, a string selection line stack on the gate stack, and a plurality of gate structures extending through the string selection line stack in the first direction, the plurality of gate structures completely overlapping the plurality of channel structures corresponding thereto in the first direction, wherein each of the plurality of gate structures includes a gate hole, a channel layer, a gate dielectric layer, and a core gate layer, the channel layer and the gate dielectric layer being stacked on a sidewall of the gate hole, and the core gate layer being in a remaining space of the gate hole, and wherein an air gap is between respective channel layers of two gate structures, which are adjacent to each other in an oblique direction relative to the first direction, from among the plurality of gate structures.

According to another aspect of the inventive concept, there is provided an electronic system including a main substrate, an integrated circuit device on the main substrate, and a controller electrically connected to the integrated circuit device on the main substrate, wherein the integrated circuit device includes a semiconductor substrate, a gate stack including a plurality of gate layers and a plurality of insulating layers, the plurality of gate layers and the plurality of insulating layers being alternately stacked on the semiconductor substrate, a plurality of channel structures extending through the gate stack in a first direction, a word line cut extending through the gate stack in the first direction, a string selection line stack on the gate stack, and a plurality of gate structures extending through the string selection line stack in the first direction, the plurality of gate structures completely overlapping the plurality of channel structures corresponding thereto in the first direction, wherein an air gap is between two gate structures, which are adjacent to each other in an oblique direction relative to the first direction, from among the plurality of gate structures.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
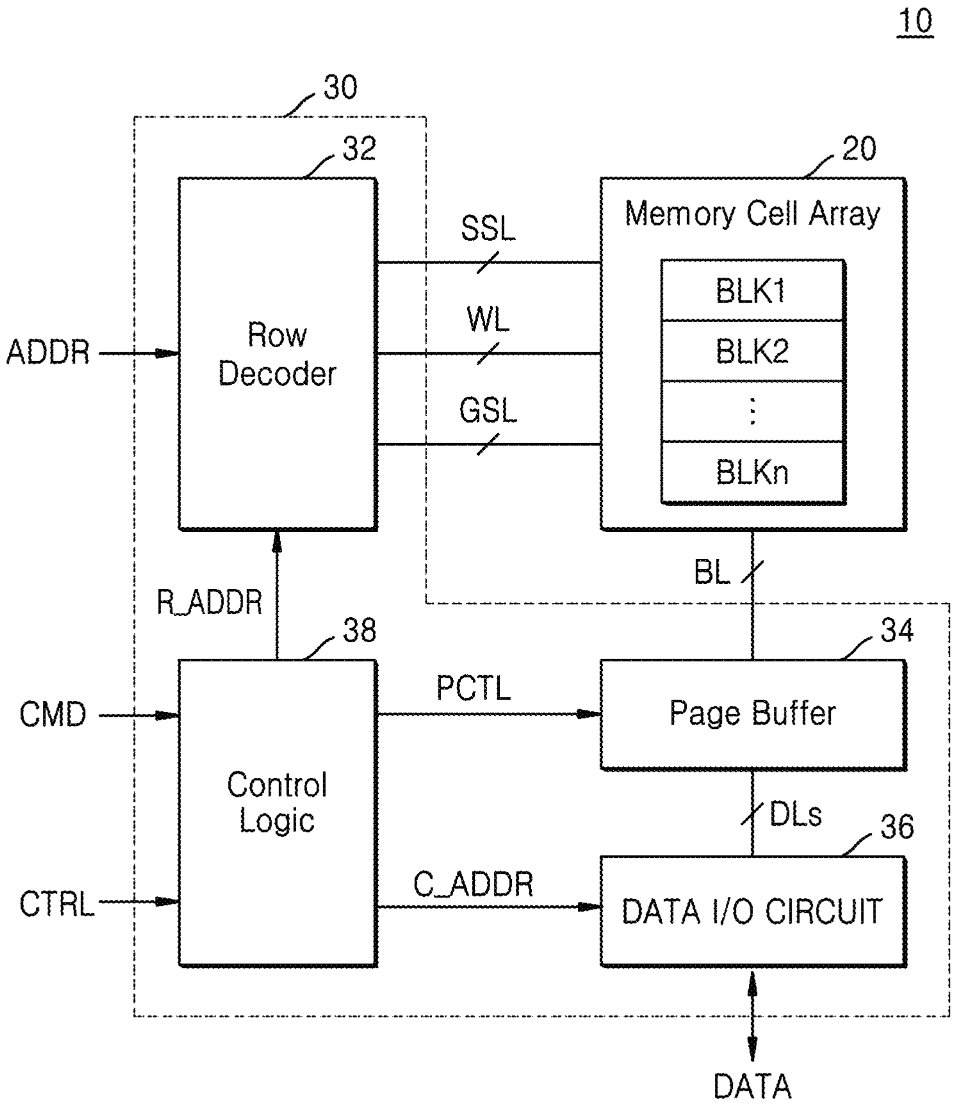
FIG. 1 is a block diagram of an integrated circuit (IC) device according to an embodiment.

Hereinafter, embodiments will be described in detail with reference to the accompanying drawings. In this description, like reference numerals may indicate like components. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of an integrated circuit (IC) device according to an embodiment.

Referring to FIG. 1, an IC device 10 may include a memory cell array 20 and a peripheral circuit 30.

The memory cell array 20 may include a plurality of memory cell blocks BLK1, BLK2, . . . , and BLKn. Each of the plurality of memory cell blocks BLK1, BLK2, . . . , and BLKn may include a plurality of memory cells. The plurality of memory cell blocks BLK1, BLK2, . . . , and BLKn may be connected to the peripheral circuit 30 through a bit line BL, a word line WL, a string selection line SSL, and a ground selection line GSL.

The memory cell array 20 may be connected to a page buffer 34 through the bit line BL and be connected to a row decoder 32 through the word line WL, the string selection line SSL, and the ground selection line GSL. In the memory cell array 20, each of the plurality of memory cells included in the plurality of memory cell blocks BLK1, BLK2, . . . , and BLKn may be a flash memory cell. The memory cell array 20 may include a three-dimensional (3D) memory cell array. The 3D memory cell array may include a plurality of NAND strings, each of which may include a plurality of memory cells connected to a plurality of word lines WL that are stacked vertically.

The peripheral circuit 30 may include the row decoder 32, a page buffer 34, a data input/output (I/O) circuit 36, and a control logic 38. Although not shown, the peripheral circuit 30 may further include various circuits, such as a voltage generating circuit configured to generate various voltages required for operations of the IC device 10, an error correction circuit configured to correct errors in data read from the memory cell array 20, an I/O interface, and the like.

The peripheral circuit 30 may receive an address ADDR, a command CMD, and a control signal CTRL from an external source outside of the IC device 10 and transmit and receive data DATA to and from a device that is outside the IC device 10. An example configuration of the peripheral circuit 30 is described in detail below.

The row decoder 32 may select at least one of the plurality of memory cell blocks BLK1, BLK2, . . . , and BLKn in response to the address ADDR transmitted from the outside and select the word line WL, the string selection line SSL, and the ground selection line GSL of the selected memory cell block. The row decoder 32 may transmit a voltage for performing a memory operation to the word line WL of the selected memory cell block.

The page buffer 34 may be connected to the memory cell array 20 through the bit line BL. In a program operation, the page buffer 34 may operate as a write driver and apply a voltage corresponding to the data DATA to be stored in the memory cell array 20 to the bit line BL. In a read operation, the page buffer 34 may operate as a sense amplifier and sense the data DATA stored in the memory cell array 20. The page buffer 34 may operate in response to a control signal PCTL provided by the control logic 38.

The data I/O circuit 36 may be connected to a page buffer 34 through data lines DLs. In the program operation, the data I/O circuit 36 may receive the data DATA from a memory controller (not shown) and provide program data DATA to the page buffer 34 based on a column address C_ADDR provided from the control logic 38. In the read operation, the data I/O circuit 36 may provide the read data DATA stored in the page buffer 34 to the memory controller, based on the column address C_ADDR provided from the control logic 38. The data I/O circuit 36 may transmit an input address or instruction to the control logic 38 or the row decoder 32.

The control logic 38 may receive the command CMD and the control signal CTRL from the memory controller. The control logic 38 may provide a row address R_ADDR to the row decoder 32 and provide the column address C_ADDR to the data I/O circuit 36. The control logic 38 may generate various internal control signals used in the IC device 10, in response to the control signal CTRL. For example, the control logic 38 may control a voltage level provided to the word line WL or the bit line BL during a memory operation, such as the program operation or an erase operation.

Figure 2:
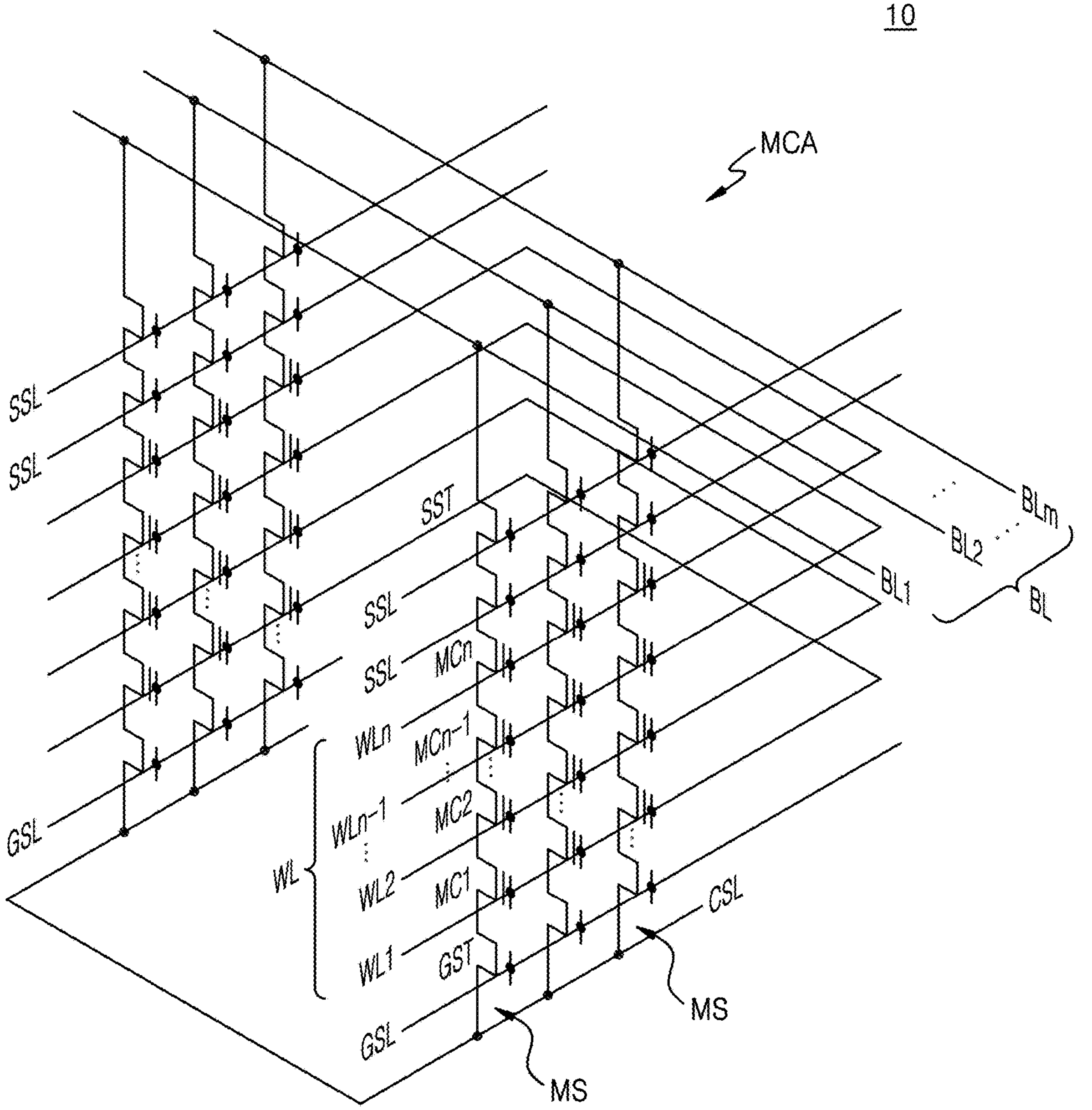
FIG. 2 is an equivalent circuit diagram of a memory cell array of an IC device according to an embodiment.

FIG. 2 is an equivalent circuit diagram of a memory cell array of an IC device according to embodiments.

FIG. 2 is an equivalent circuit diagram of a vertical NAND (VNAND) flash memory device having a vertical channel structure.

In an IC device 10 according to embodiments of the inventive concept, a memory cell array MCA may include a plurality of memory cell strings MS. The memory cell array MCA may include a plurality of bit lines BL, a plurality of word lines WL, at least one string selection line SSL, at least one ground selection line GSL, and a common source line CSL.

A plurality of memory cell strings MS may be between the plurality of bit lines BL and the common source line CSL. Although each of the plurality of memory cell strings MS is illustrated as including two string selection lines SSL, embodiments of the inventive concept are not limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn−1, MCn. A drain region of the string selection transistor SST may be connected to a bit line BL, and a source region of the ground selection transistor GST may be connected to the common source line CSL. The common source line CSL may be a region to which source regions of a plurality of the ground selection transistor GST are connected in common.

The string selection transistor SST may be connected to the string selection line SSL, and the ground selection transistor GST may be connected to the at least one ground selection line GSL. The plurality of memory cell transistors MC1, MC2, . . . , MCn−1, and MCn may be connected to the plurality of word lines WL, respectively.

Figure 3:
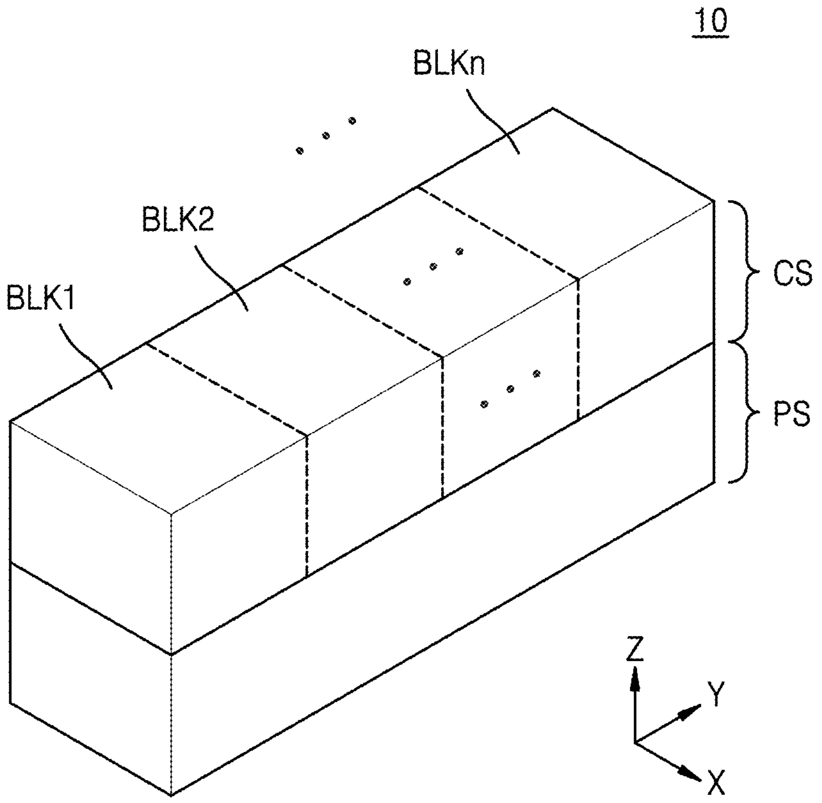
FIG. 3 is a perspective view of an IC device according to an embodiment.

FIG. 3 is a perspective view of an IC device according to an embodiment.

Referring to FIG. 3, an IC device 10 may include a memory cell array structure CS and a peripheral circuit structure PS, which overlap each other in a vertical direction (i.e., Z direction).

The memory cell array structure CS may include the memory cell array 20 described with reference to FIG. 1. The peripheral circuit structure PS may include the peripheral circuit 30 described with reference to FIG. 1.

The memory cell array structure CS may include a plurality of tiles. Each of the plurality of tiles may include a plurality of memory cell blocks BLK1, BLK2, . . . , and BLKn. Each of the plurality of memory cell blocks BLK1, BLK2, . . . , and BLKn may include memory cells arranged three-dimensionally.

In some embodiments, two tiles may constitute one mat, without being limited thereto. For example, the memory cell array 20 described with reference to FIG. 1 may include a plurality of mats.

Figure 4:
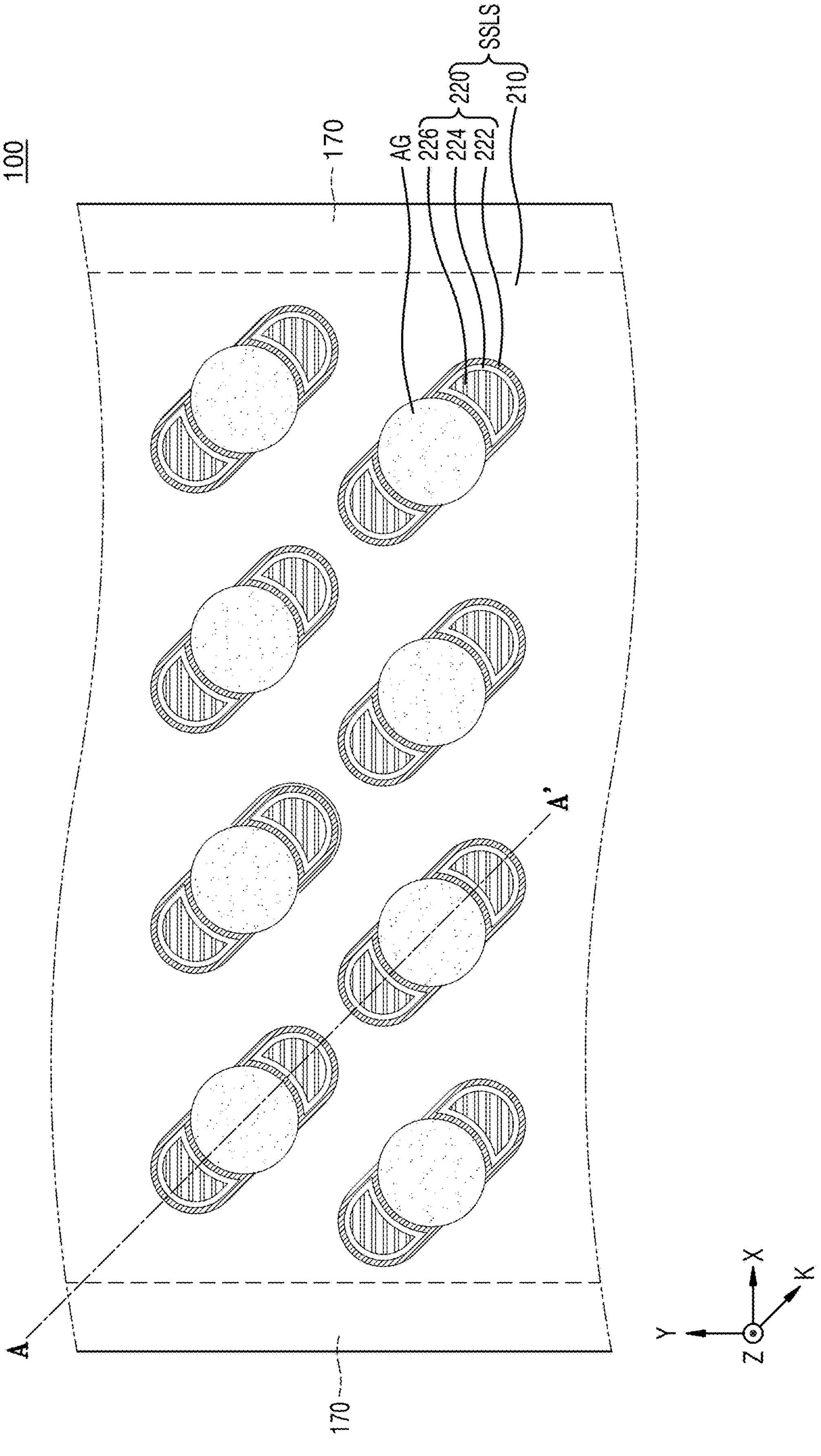
FIG. 4 is a plan view of components of an IC device according to an embodiment.
Figure 5:
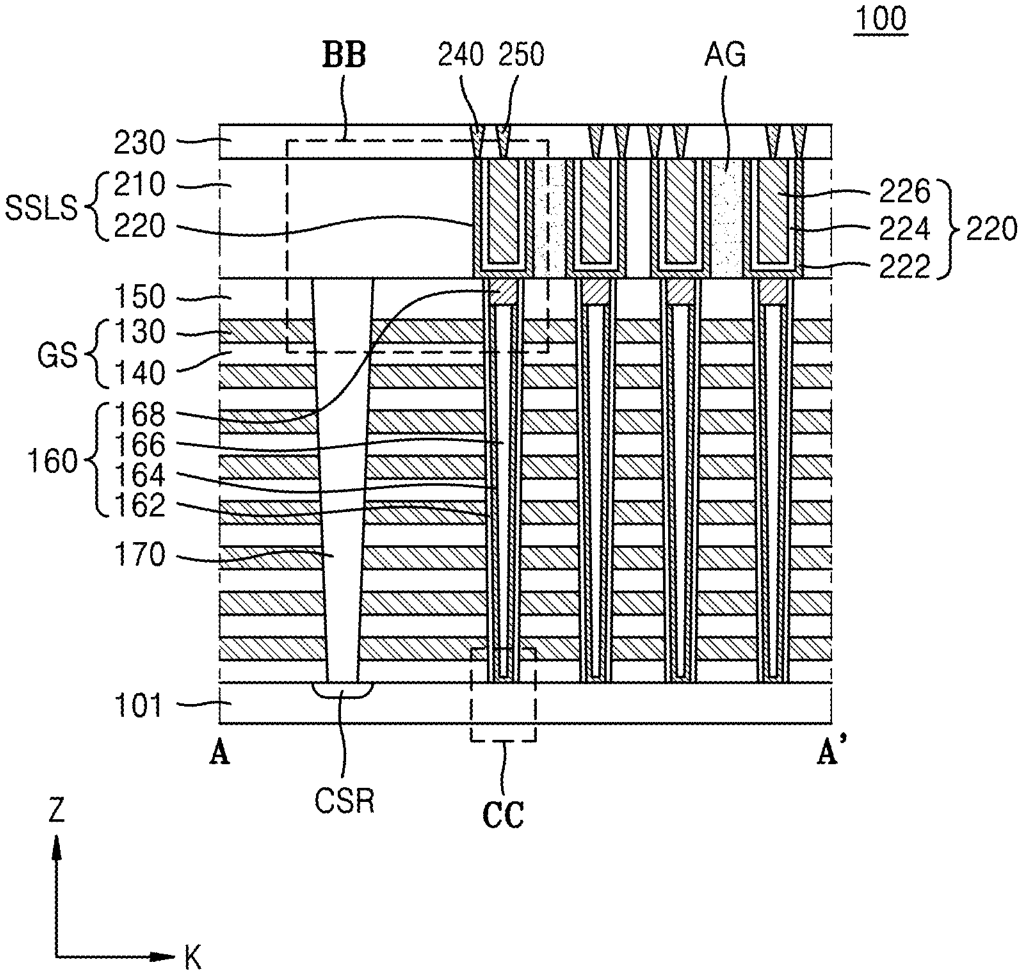
FIG. 5 is a cross-sectional view taken along line A-A' of FIG. 4.
Figure 6:
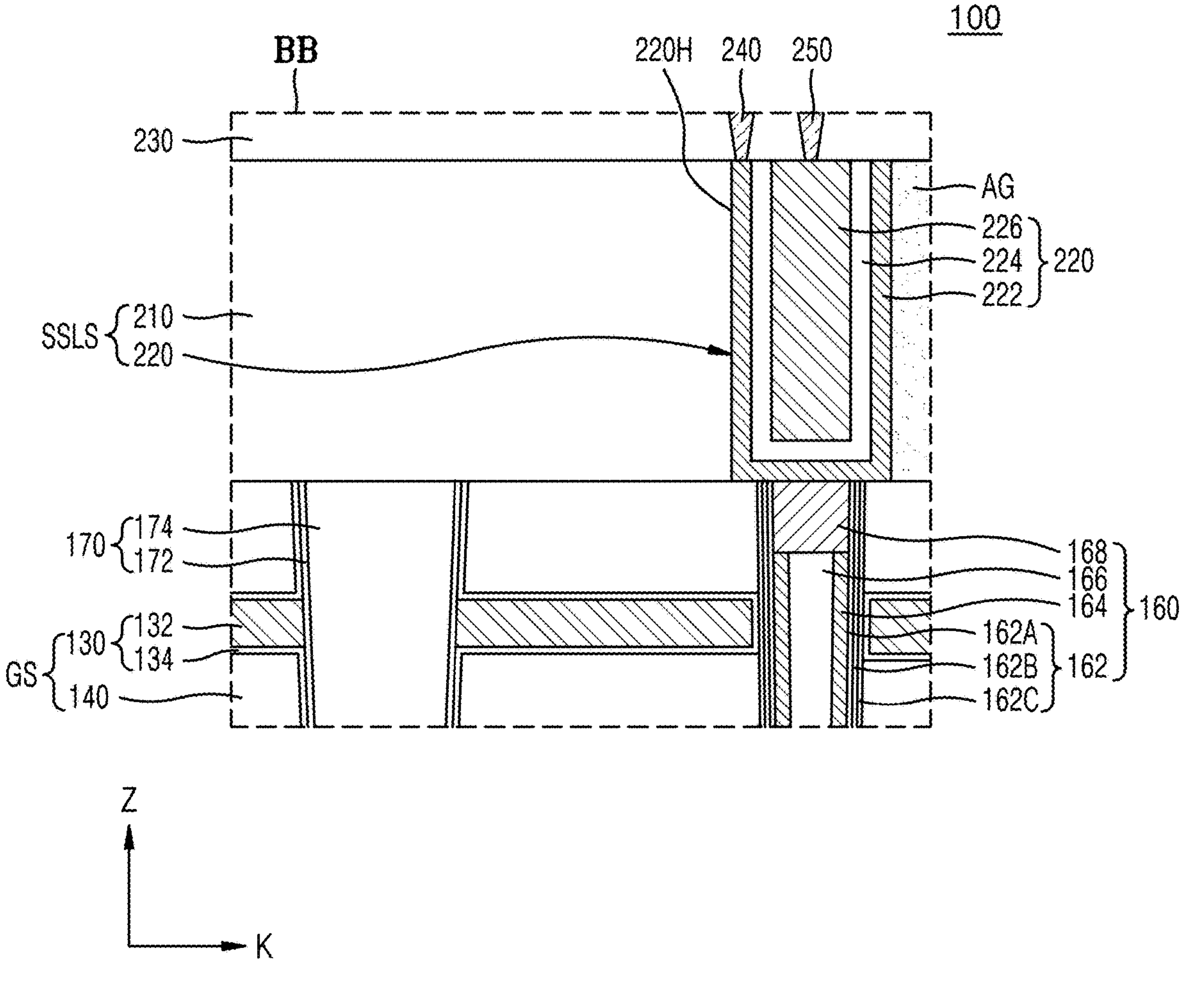
FIG. 6 is an enlarged view of portion BB of FIG. 5.
Figure 7:
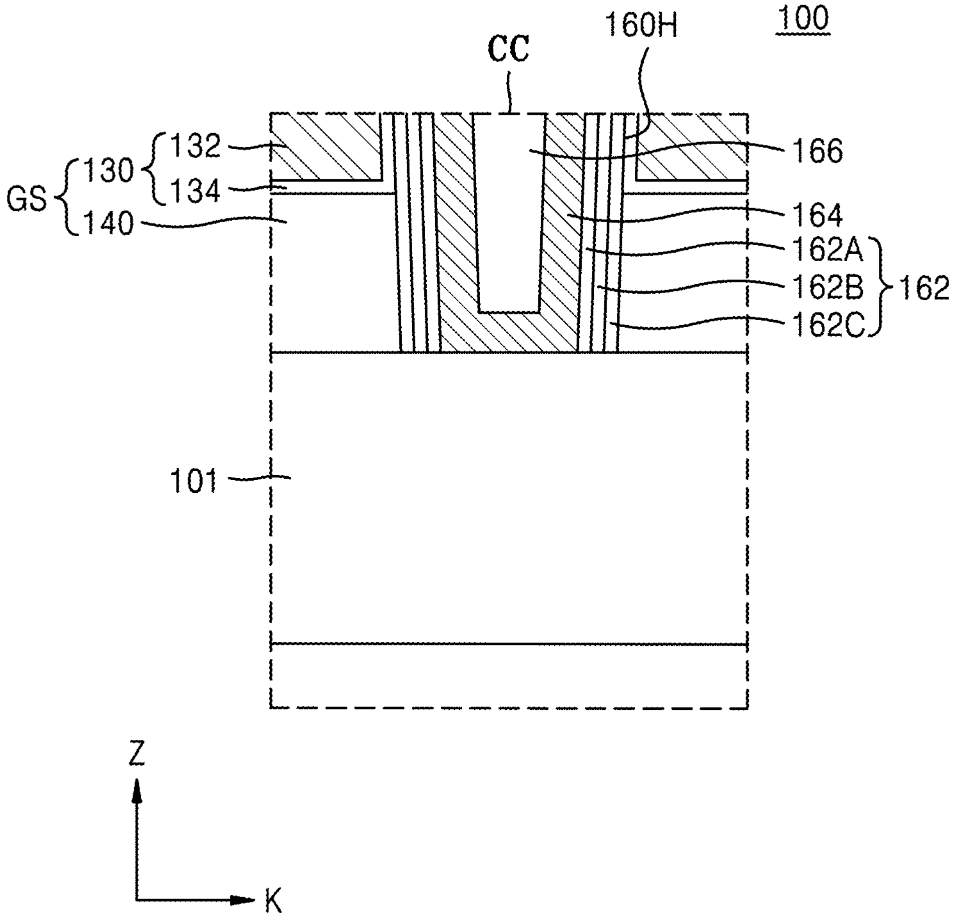
FIG. 7 is an enlarged view of portion CC of FIG. 5.

FIG. 4 is a plan view of components of an IC device according to an embodiment. FIG. 5 is a cross-sectional view taken along line A-A' of FIG. 4. FIG. 6 is an enlarged view of portion BB of FIG. 5. FIG. 7 is an enlarged view of portion CC of FIG. 5.

Referring to FIGS. 4 to 7 together, an IC device 100 may include a string selection line stack SSLS on a gate stack GS.

A semiconductor substrate 101 may include a semiconductor material, for example, a Group-IV semiconductor, a Group III-V compound semiconductor, or a Group II-VI oxide semiconductor. For example, the Group-IV semiconductor may include silicon (Si), germanium (Ge), or silicon-germanium. The semiconductor substrate 101 may be provided as a bulk wafer or a wafer in which an epitaxial layer is formed. In other embodiments, the semiconductor substrate 101 may include a silicon-on-insulator (SOI) substrate or a germanium-on-insulator (GeOI) substrate.

The gate stack GS may extend on the semiconductor substrate 101 in a first lateral direction (X direction) and a second lateral direction (Y direction), which are parallel to a main surface of the semiconductor substrate 101. The gate stack GS may include a plurality of gate layers 130 and a plurality of insulating layers 140. The plurality of gate layers 130 and the plurality of insulating layers 140 may be alternately arranged in a vertical direction (Z direction), which is perpendicular to a top surface of the semiconductor substrate 101. Also, a top insulating layer 150 may be on a top end of the gate stack GS.

The gate layer 130 may include a buried conductive layer 132 and an insulating liner 134 configured to a top surface, a bottom surface, and a side surface of the buried conductive layer 132. For example, the buried conductive layer 132 may include a metal (e.g., tungsten), a metal silicide (e.g., tungsten silicide), doped polysilicon, or a combination thereof. In some embodiments, the insulating liner 134 may include a high-k dielectric material, such as aluminum oxide.

The plurality of gate layers 130 may correspond to a ground selection line GSL and a word line WL, which constitute the memory cell string MS described above with reference to FIG. 2. For example, a lowermost one of the gate layers 130 may function as the ground selection line GSL, and each of the remaining gate layers 130 may function as the word line WL. The gate stack GS may also be referred to as a word line stack based on the above-described function.

A plurality of word line cuts 170 may extend in the second lateral direction (Y direction) on the semiconductor substrate 101. A gate stack GS located between a pair of word line cuts 170 may constitute one block, and the pair of word line cuts 170 may define a width of the gate stack GS in the first lateral direction (X direction). The word line cut 170 may include an insulating spacer 172 and insulating isolation layer 174. That is, the word line cut 170 may include an insulating structure. A plurality of common source regions CSR may be formed in the semiconductor substrate 101. The plurality of common source regions CSR may be heavily-doped impurity regions.

A plurality of channel structures 160 may pass or extend through the gate stack GS from a top surface of the semiconductor substrate 101 and extend in the vertical direction (Z direction). The plurality of channel structures 160 may be arranged a predetermined distance apart from each other in the first lateral direction (X direction) and the second lateral direction (Y direction). The plurality of channel structures 160 may be arranged in a zigzag form or a staggered form. In some embodiments, a top level of the plurality of channel structures 160 may substantially be at the same as a top level of the word line cut 170.

The plurality of channel structures 160 may be formed to extend inside a channel hole 160H passing through the gate stack GS. Each of the plurality of channel structures 160 may include a first gate dielectric layer 162, a first channel layer 164, a buried insulating layer 166, and a conductive plug 168. The first gate dielectric layer 162 and the first channel layer 164 may be sequentially on a sidewall of the channel hole 160H. For example, the first gate dielectric layer 162 may be conformally formed on the sidewall of the channel hole 160H, and the first channel layer 164 may be conformally formed on a sidewall and a bottom portion of the first gate dielectric layer 162. A buried insulating layer 166 at least partially filling a remaining space of the channel hole 160H may be on the first channel layer 164. On the channel hole 160H, the conductive plug 168 may be in contact with the first channel layer 164 and may block an entrance (e.g., a top end) of the channel hole 160H.

The plurality of channel structures 160 may be in contact with the semiconductor substrate 101. In some embodiments, the first channel layer 164 may be in contact with the top surface of the semiconductor substrate 101 at the bottom of the channel hole 160H. In other embodiments, a contact semiconductor layer (not shown) having a predetermined height may be formed on the semiconductor substrate 101 at the bottom of the channel hole 160H, and the first channel layer 164 may be electrically connected to the semiconductor substrate 101 through the contact semiconductor layer.

In still other embodiments, a portion of the first gate dielectric layer 162 may be removed from a lower region of each of the plurality of channel structures 160, and thus, the first channel layer 164 may be exposed. That is, the sidewall and the bottom portion of the first gate dielectric layer 162 may be apart from each other with the exposed portion of the first channel layer 164 therebetween in the vertical direction (Z direction). Also, the bottom portion of the first gate dielectric layer 162 may border and at least partially surround a bottom surface of the first channel layer 164 as described in detail below with reference to FIG. 14.

The first gate dielectric layer 162 may include a tunneling dielectric film 162A, a charge storage film 162B, and a blocking dielectric film 162C, which are sequentially stacked on an outer sidewall of the first channel layer 164. Relative thicknesses of the tunneling dielectric film 162A, the charge storage film 162B, and the blocking dielectric film 162C, which are included in the first gate dielectric layer 162, are not limited to the illustration and may be variously modified.

The tunneling dielectric film 162A may include silicon oxide, hafnium oxide, aluminum oxide, zirconium oxide, and/or tantalum oxide. The charge storage film 162B may be a region in which electrons passing through the tunneling dielectric film 162A from the first channel layer 164 may be stored. The charge storage film 162B may include silicon nitride, boron nitride, silicon boron nitride, or doped polysilicon. The blocking dielectric film 162C may include silicon oxide, silicon nitride, or a metal oxide having a higher dielectric constant than silicon oxide.

In other embodiments, each of the plurality of channel structures 160 may include a ferroelectric material layer and a vertical channel layer, which are sequentially stacked on the sidewall of the channel hole 160H, a buried insulating layer 166 at least partially filling the remaining space of the channel hole 160H, and a conductive plug 168 configured to block an entrance of the channel hole 160H.

In still other embodiments, each of the plurality of channel structures 160 may include a vertical channel layer and a variable resistive material layer, which are sequentially stacked on the sidewall of the channel hole 160H, a buried insulating layer 166 at least partially filling the remaining space of the channel hole 160H, and a conductive plug 168 configured to block an entrance of the channel hole 160H.

In the IC device 100 according to embodiments of the inventive concept, the string selection line stack SSLS may be on the gate stack GS and the word line cut 170. The string selection line stack SSLS may include a first upper insulating layer 210 on and at least partially covering the gate stack GS and the word line cut 170. In addition, the string selection line stack SSLS may include a plurality of gate structures 220, which extend or pass through the first upper insulating layer 210 in the vertical direction (Z direction) and overlap the plurality of channel structures 160 corresponding thereto in the vertical direction.

The plurality of gate structures 220 may be formed to extend inside a gate hole 220H extending or passing through the string selection line stack SSLS. Each of the plurality of gate structures 220 may include a second channel layer 222, a second gate dielectric layer 224, and a core gate layer 226. The second channel layer 222 and the second gate dielectric layer 224 may be sequentially stacked on a sidewall of the gate hole 220H. For example, the second channel layer 222 may be conformally formed on the sidewall of the gate hole 220H, and the second gate dielectric layer 224 may be conformally formed on a sidewall and a bottom portion of the second channel layer 222. The core gate layer 226 at least partially filling a remaining space of the gate hole 220H may be on the second gate dielectric layer 224. Accordingly, all sidewalls and a bottom surface of the core gate layer 226 may be bordered or at least partially surrounded by the second channel layer 222.

In the IC device 100 according to the inventive concept, a lateral width of an uppermost surface of the channel hole 160H of each of the plurality of channel structures 160 may be less than a lateral width of a bottom surface of the second channel layer 222 of each of the plurality of gate structures 220, which corresponds thereto in an oblique direction (i.e., K direction). In some embodiments, in each of the plurality of gate structures 220, an uppermost surface of the second channel layer 222, an uppermost surface of the second gate dielectric layer 224, and an uppermost surface of the core gate layer 226 may be coplanar with each other. In a view from above or plan view, at least one sidewall of each of the plurality of gate structures 220 may be designed to have a rounded shape.

In the IC device 100 according to embodiments of the inventive concept, an air gap AG may be between two adjacent gate structures 220, which are adjacent to each other in an oblique direction (K direction), from among the plurality of gate structures 220. Here, the air gap AG may refer to an empty space bordered or at least partially surrounded by a gate stack GS, a gate structure 220, and a second upper insulating layer 230. In a view from above or plan view, the air gap AG may be formed to have a circular shape.

In some embodiments, the two adjacent gate structures 220 may be symmetrically arranged about the air gap AG in a mirror image configuration. In addition, the air gap AG may be in contact with the second channel layer 222 of each of the two adjacent gate structures 220. That is, the two adjacent gate structures 220 may be designed to share one air gap AG therebetween.

Each of the plurality of gate structures 220 may include an upper bit line contact 240 and an upper word line contact 250. The upper bit line contact 240 may extend or pass through the second upper insulating layer 230 and contact the uppermost surface of the second channel layer 222 in the vertical direction. The upper word line contact 250 may extend or pass through the second upper insulating layer 230 and contact the uppermost surface of the core gate layer 226 in the vertical direction.

The IC device 100 according to embodiments of the inventive concept may be designed such that the string selection line stack SSLS is on the gate stack GS in a vertical memory device having a 3D structure and the gate structures 220 serving as string selection lines are isolated and separated from each other. In addition, the air gap AG serving as an isolation insulating film may be formed without adding a manufacturing operation so that the gate structures 220, which are isolated from each other, may perform operations independent of each other. Thus, the manufacturing process may be simplified.

Furthermore, the IC device 100 according to embodiments of the inventive concept may be designed such that the upper bit line contact 240 and the upper word line contact 250 are brought into contact with each of the isolated gate structures 220 in the vertical direction (Z direction). Thus, process margins for forming contacts may efficiently improve.

Ultimately, while forming the gate structure 220 functioning as the string selection line by simplifying a manufacturing process, the IC device 100 according to embodiments of the inventive concept may have an effect of efficiently improving the process margins during the formation of the contacts.

Figure 8:
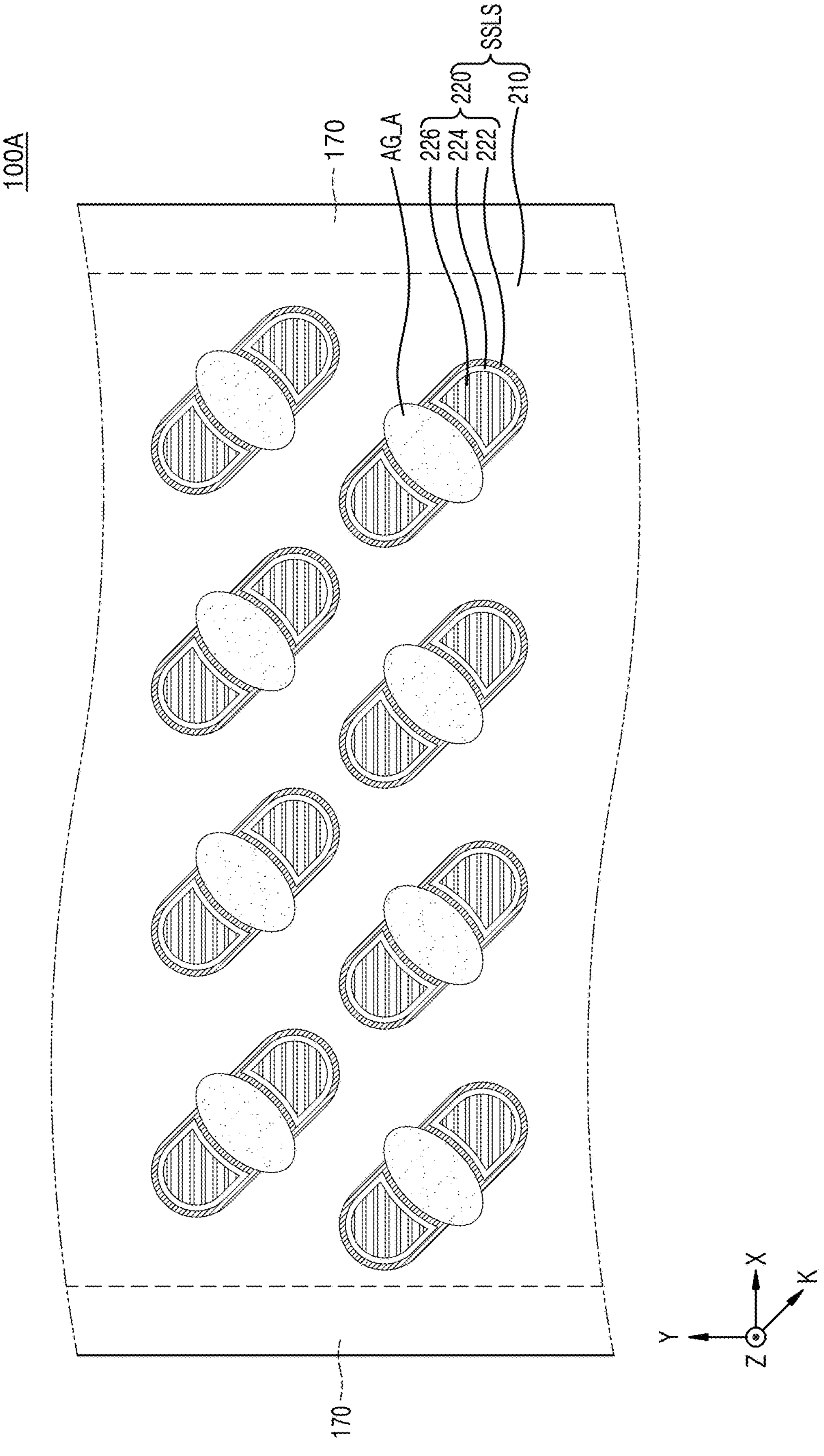
FIGS. 8 to 10 are cross-sectional views of IC devices according to embodiments.
Figure 9:
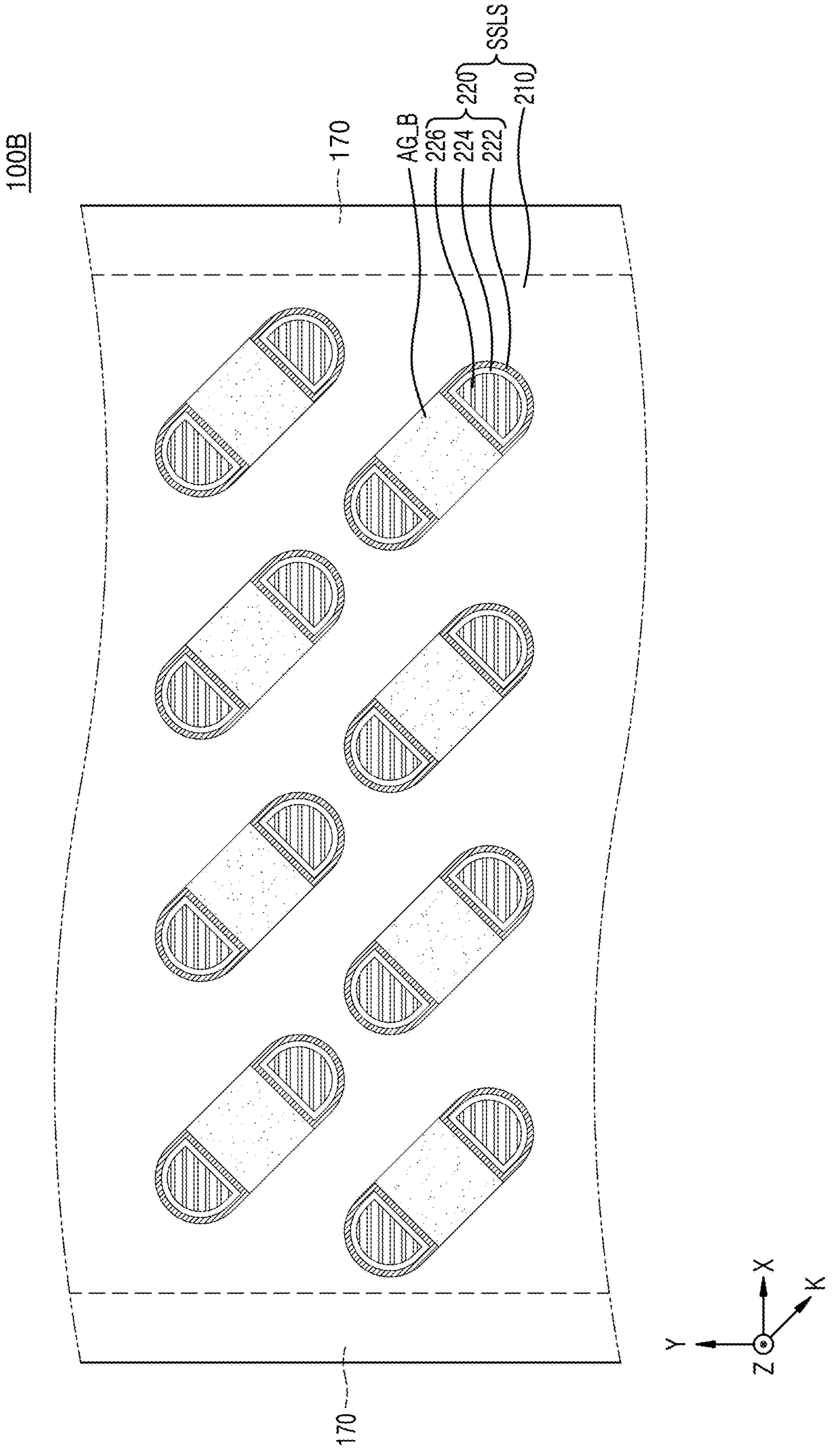
Figure 10:
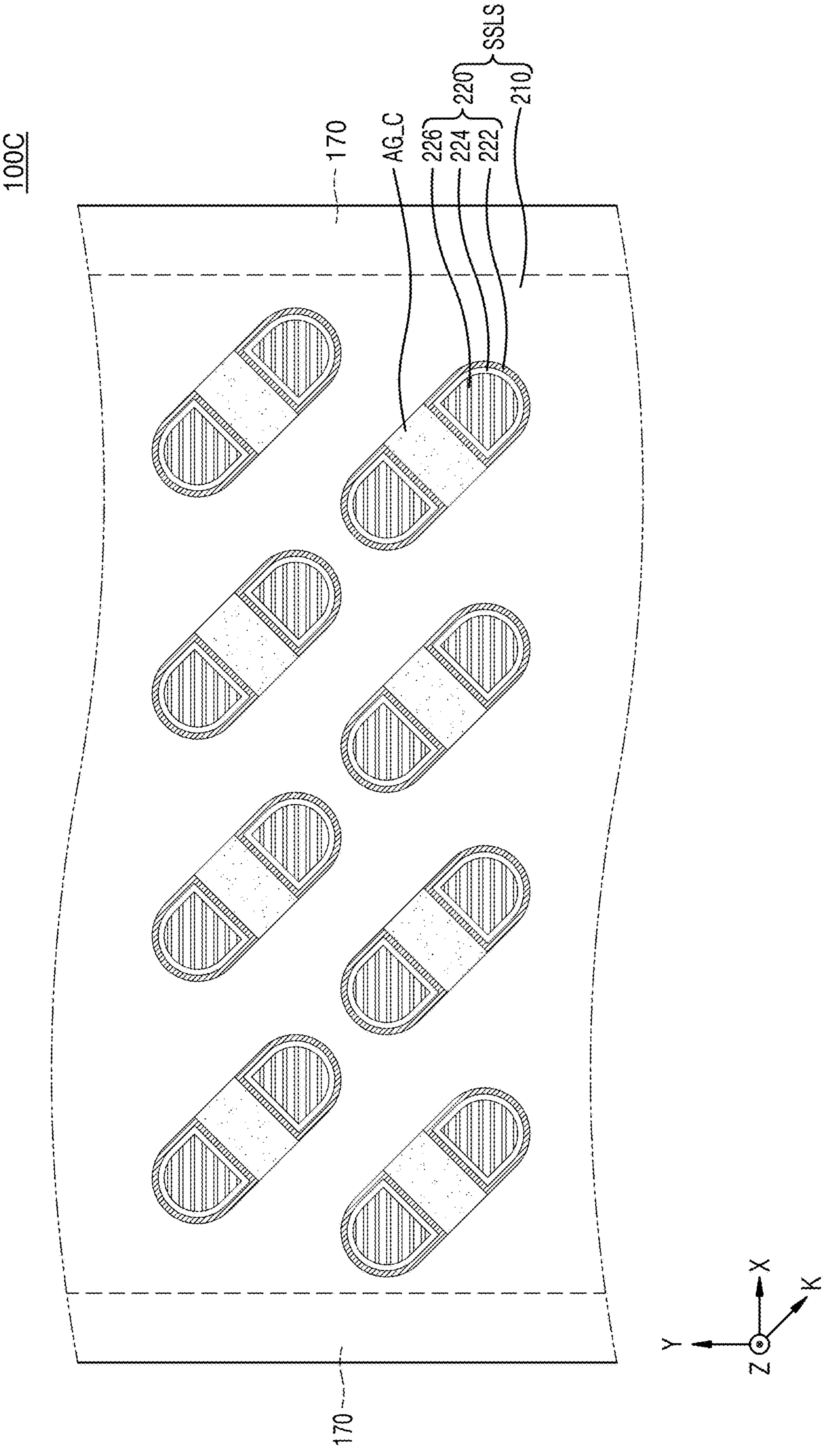

FIGS. 8 to 10 are cross-sectional views of IC devices according to embodiments.

Most of the components included in IC devices 100A, 100B, and 100C described below and materials included in the components are substantially the same as or similar to those described above with reference to FIGS. 4 to 7. Accordingly, for brevity, descriptions focus on differences between the IC devices 100A, 100B, and 1200C and the IC device 100 described above.

Referring to FIG. 8, an IC device 100A may include an air gap AG_A between two gate structures 220, which are adjacent to each other in an oblique direction (K direction).

In the IC device 100A according to the present embodiment, the air gap AG_A may be between two gate structures 220, which are adjacent to each other in the oblique direction (K direction), from among the plurality of gate structures 220), to electrically isolate the two adjacent gate structures 220 from each other. In a view from above or a plan view, the air gap AG_A may be formed to have an elliptical shape.

In some embodiments, the two adjacent gate structures 220 may be symmetrically arranged about the air gap AG_A in a mirror image configuration. In addition, the air gap AG_A may be in contact with a second channel layer 222 of each of the two adjacent gate structures 220. That is, the two adjacent gate structures 220 may be designed to share one air gap AG_A therebetween.

Referring to FIG. 9, an IC device 100B may include an air gap AG_B between two gate structures 220, which are adjacent to each other in the oblique direction (K direction).

In the IC device 100B according to the present embodiment, the air gap AG_B may be between two gate structures 220, which are adjacent to each other in the oblique direction (K direction), from among the plurality of gate structures 220, to electrically isolate the two adjacent gate structures 220 from each other. In a view from above or plan view, the air gap AG_B may be formed to have a square shape.

In some embodiments, the two adjacent gate structures 220 may be symmetrically arranged about the air gap AG_B in a mirror image configuration. In addition, the air gap AG_B may be in contact with a second channel layer 222 of each of the two adjacent gate structures 220. That is, the two adjacent gate structures 220 may be designed to share one air gap AG_B therebetween.

Referring to FIG. 10, an IC device 100C may include an air gap AG_C between two gate structures 220, which are adjacent to each other in the oblique direction (K direction).

In the IC device 100C according to the present embodiment, the air gap AG_C may be between two gate structures 220, which are adjacent to each other in the oblique direction (K direction), from among the plurality of gate structures 220, to electrically isolate the two adjacent gate structures 220 from each other. In a view from above or plan view, the air gap AG_C may be formed to have a rectangular shape.

In some embodiments, the two adjacent gate structures 220 may be symmetrically arranged about the air gap AG_C in a mirror image configuration. In addition, the air gap AG_C may be in contact with a second channel layer 222 of each of the two adjacent gate structures 220. That is, the two adjacent gate structures 220 may be designed to share one air gap AG_C therebetween.

Figure 11:
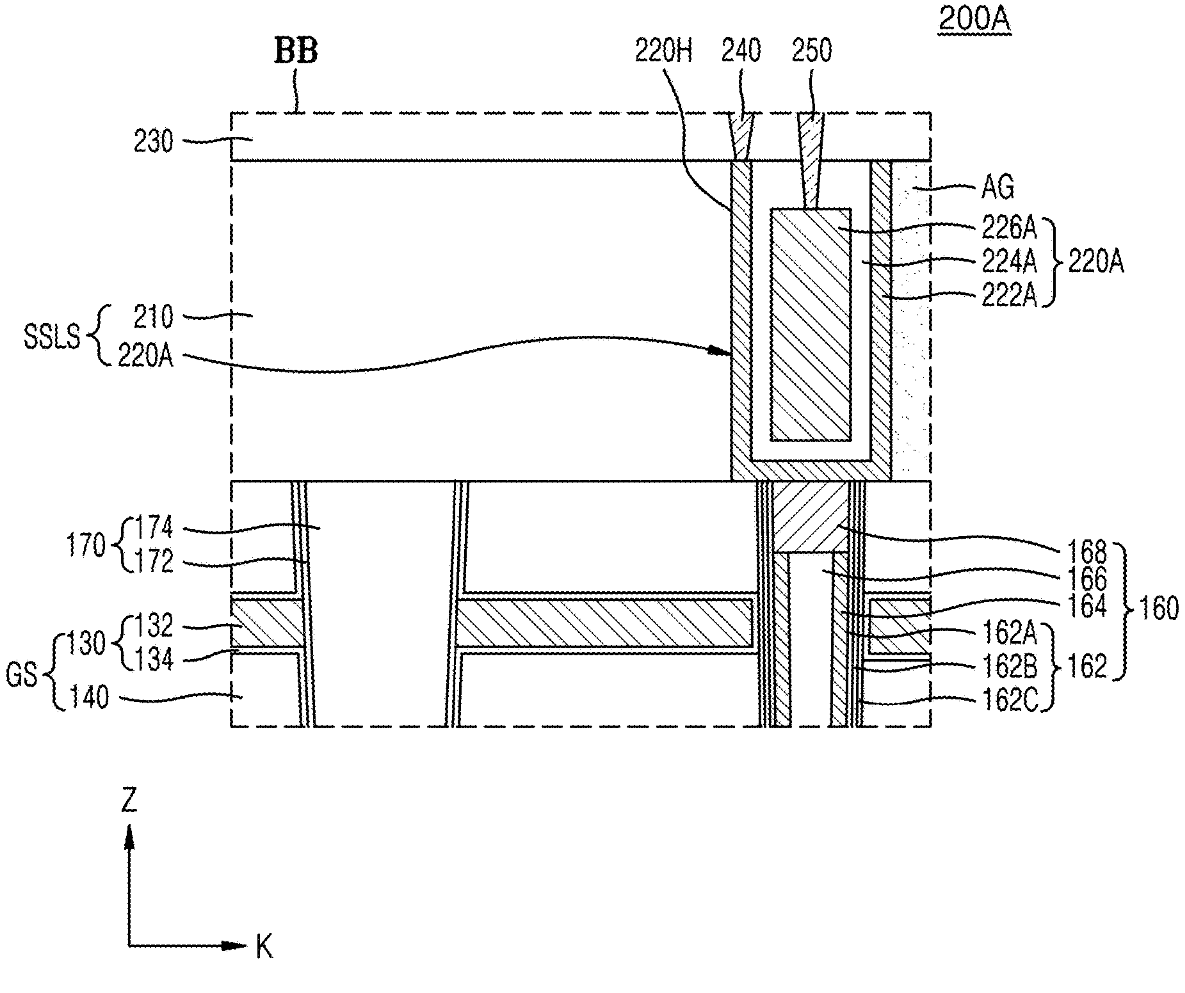
FIGS. 11 to 13 are cross-sectional views of IC devices according to embodiments.
Figure 12:
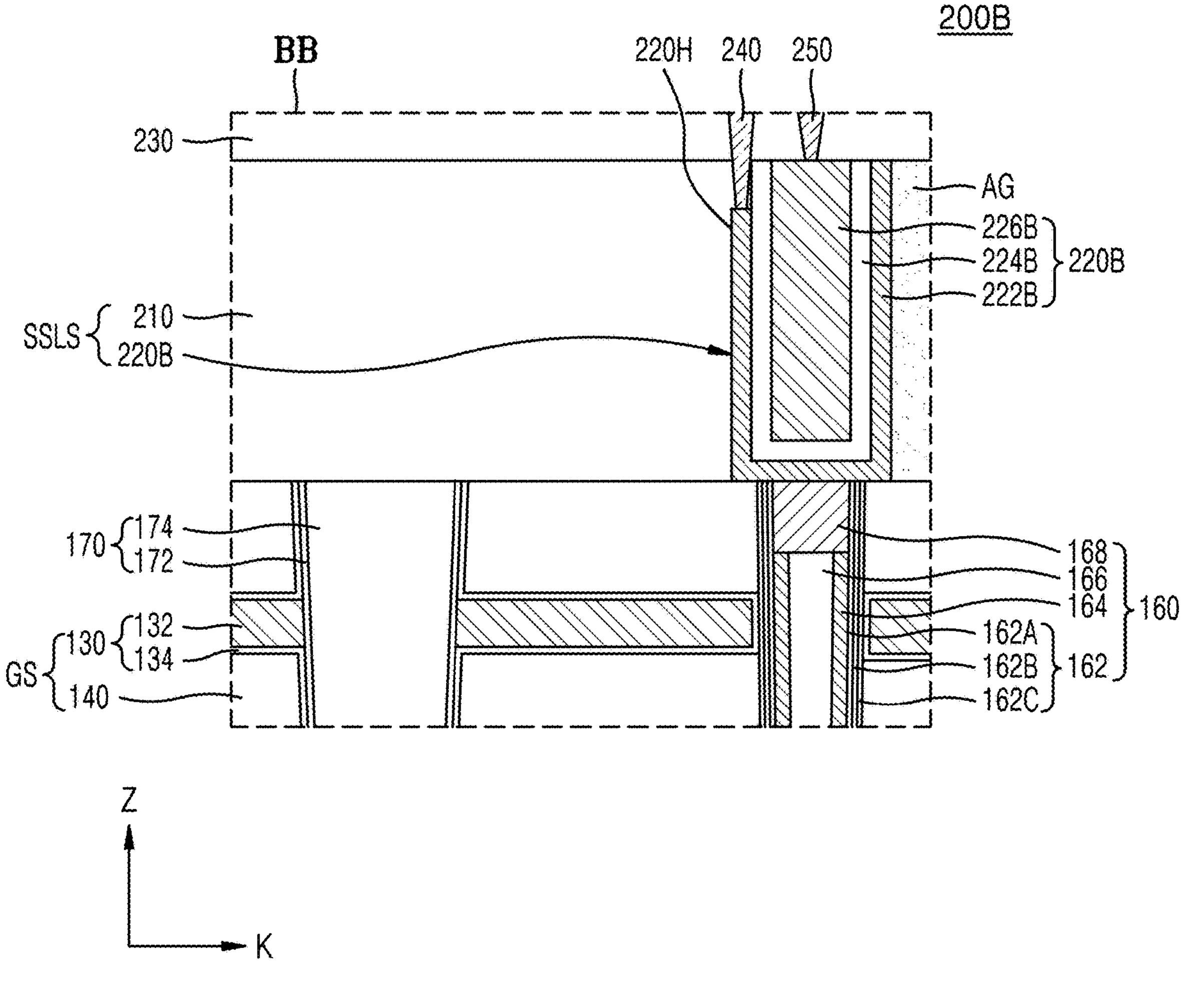
Figure 13:
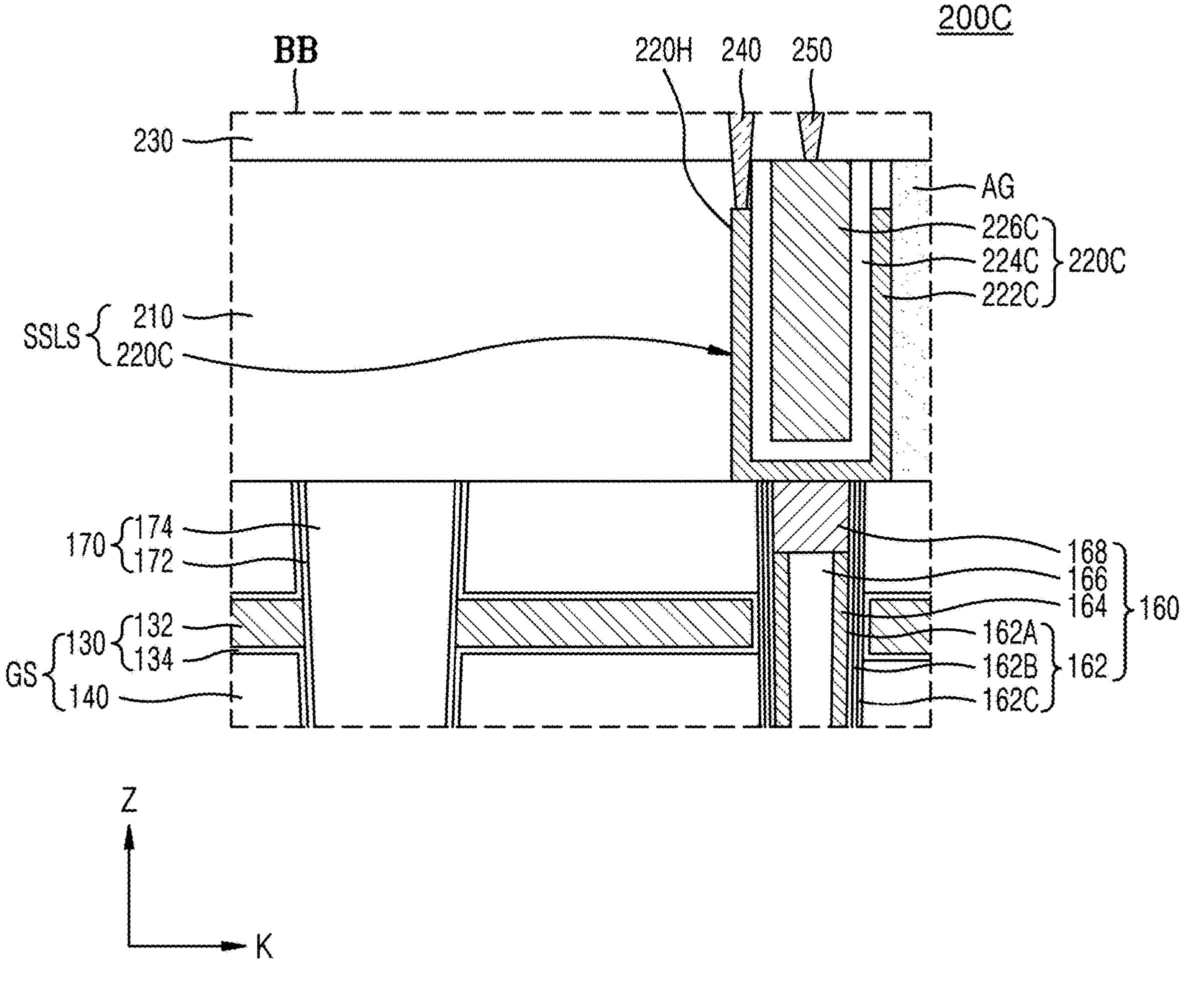

FIGS. 11 to 13 are cross-sectional views of IC devices according to embodiments.

Most of components included in IC devices 200A, 200B, and 200C described below and materials included in the components are substantially the same as or similar to those described above with reference to FIGS. 4 to 7. Thus, for brevity, descriptions focus on differences between the IC devices 200A, 200B, and 200C and the IC device 100 described above.

Referring to FIG. 11, an IC device 200A may include a plurality of gate structures 220A, which are formed to extend inside a plurality of gate holes 220H extending or passing through a string selection line stack SSLS.

In the IC device 200A according to the present embodiment, the plurality of gate structures 220A may be formed to extend inside the gate hole 220H passing through a string selection line stack SSLS. Each of the plurality of gate structures 220A may include a second channel layer 222A, a second gate dielectric layer 224A, and a core gate layer 226A. The second channel layer 222A and the second gate dielectric layer 224A may be sequentially stacked on a sidewall of the gate hole 220H. For example, the second channel layer 222A may be conformally formed on the sidewall of the gate hole 220H, and the second gate dielectric layer 224A may be conformally formed on a sidewall and a bottom portion of the second channel layer 222A. A core gate layer 226A at least partially filling a portion of the remaining space of the gate hole 220H may be on the second gate dielectric layer 224A. Also, the second gate dielectric layer 224A may be on the core gate layer 226A. Accordingly, all surfaces of the core gate layer 226A may be bordered or at least partially surrounded by the second channel layer 222A. That is, each of the plurality of gate structures 220A may be formed to have a channel all around (CAA) structure.

In the IC device 200A according to the inventive concept, in each of the plurality of gate structures 220A, an uppermost surface of the second channel layer 222A and an uppermost surface of the second gate dielectric layer 224A may be at substantially the same level that is a first vertical level, and an uppermost surface of the core gate layer 226A may be at a second vertical level, which is lower than the first vertical level in the cross-sectional view of FIG. 11.

In the IC device 200A according to embodiments of the inventive concept, each of the plurality of gate structures 220A may include an upper bit line contact 240 and an upper word line contact 250. The upper bit line contact 240 may extend or pass through the second upper insulating layer 230 and contact the uppermost surface of the second channel layer 222A in a vertical direction. The upper word line contact 250 may extend or pass through the second upper insulating layer 230 and the second gate dielectric layer 224A and contact the uppermost surface of the core gate layer 226A in the vertical direction. Here, a lowermost surface of the upper bit line contact 240 may be at a higher vertical level than a lowermost surface of the upper word line contact 250 as shown in the cross-sectional view of FIG. 11.

Referring to FIG. 12, an IC device 200B may include a plurality of gate structures 220B, which are formed to extend inside a plurality of gate holes 220H extending or passing through a string selection line stack SSLS.

In the IC device 200B according to the present embodiment, the plurality of gate structures 220B may be formed to extend inside the gate hole 220H passing through the string selection line stack SSLS. Each of the plurality of gate structures 220B may include a second channel layer 222B, a second gate dielectric layer 224B, and a core gate layer 226B. The second channel layer 222B and the second gate dielectric layer 224B may be sequentially stacked on a sidewall of the gate hole 220H. For example, the second channel layer 222B may be conformally formed on the sidewall of the gate hole 220H, and the second gate dielectric layer 224B may be conformally formed on a sidewall and a bottom portion of the second channel layer 222B. The core gate layer 226B at least partially filling the remaining space of the gate hole 220H may be on the second gate dielectric layer 224B.

In the IC device 200B according to embodiments of the inventive concept, in each of the plurality of gate structures 220B, an uppermost surface of the second channel layer 222B, an uppermost surface of the second gate dielectric layer 224B, and an uppermost surface of the core gate layer 226B may be at substantially the same level, which is a first vertical level as shown in the cross-sectional view of FIG. 12. However, a portion of the second channel layer 222B, which is farthest from the air gap AG in an oblique direction (K direction), may have a top surface at a second vertical level that is lower than the first vertical level as shown in the cross-sectional view of FIG. 12.

In the IC device 200B according to embodiments of the inventive concept, each of the plurality of gate structures 220B may include an upper bit line contact 240 and an upper word line contact 250. The upper bit line contact 240 may extend or pass through the second upper insulating layer 230 and contact the uppermost surface of the second channel layer 222B in a vertical direction, and the upper word line contact 250 may extend or pass through the second upper insulating layer 230 and the second gate dielectric layer 224B and contact the uppermost surface of the core gate layer 226B in the vertical direction. Here, a lowermost surface of the upper bit line contact 240 may be at a lower vertical level than a lowermost surface of the upper word line contact 250 in the cross-sectional view of FIG. 12.

Referring to FIG. 13, an IC device 200C may include a plurality of gate structures 220C, which are formed to extend inside a plurality of gate holes 220H passing through a string selection line stack SSLS.

In the IC device 200C according to the present embodiment, the plurality of gate structures 220C may be formed to extend inside the gate hole 220H passing through the string selection line stack SSLS. Each of the plurality of gate structures 220C may include a second channel layer 222C, a second gate dielectric layer 224C, and a core gate layer 226C. The second channel layer 222C and the second gate dielectric layer 224C may be sequentially stacked on a sidewall of the gate hole 220H. For example, the second channel layer 222C may be conformally formed on the sidewall of the gate hole 220H, and the second gate dielectric layer 224C may be conformally formed on a sidewall and a bottom portion of the second channel layer 222C. The core gate layer 226C at least partially filling a remaining space of the gate hole 220H may be on the second gate dielectric layer 224C.

In the IC device 200C according to embodiments of the inventive concept, in each of the plurality of gate structures 220C, an uppermost surface of the second gate dielectric layer 224C and an uppermost surface of the core gate layer 226C may be at substantially the same first vertical level as each other, and an uppermost surface of the second channel layer 222C may be at a second vertical level lower than the first vertical level in the cross-sectional view of FIG. 13.

In the IC device 200C according to embodiments of the inventive concept, each of the plurality of gate structures 220C may include an upper bit line contact 240 and an upper word line contact 250. The upper bit line contact 240 may extend or pass through the second upper insulating layer 230 and contact the uppermost surface of the second channel layer 222C in the vertical direction. The upper word line contact 250 may extend or pass through the second upper insulating layer 230 and the second gate dielectric layer 224C and contact the uppermost surface of the core gate layer 226C in the vertical direction. Here, a lowermost surface of the upper bit line contact 240 may be at a lower vertical level than a lowermost surface of the upper word line contact 250 in the cross-sectional view of FIG. 13.

Figure 14:
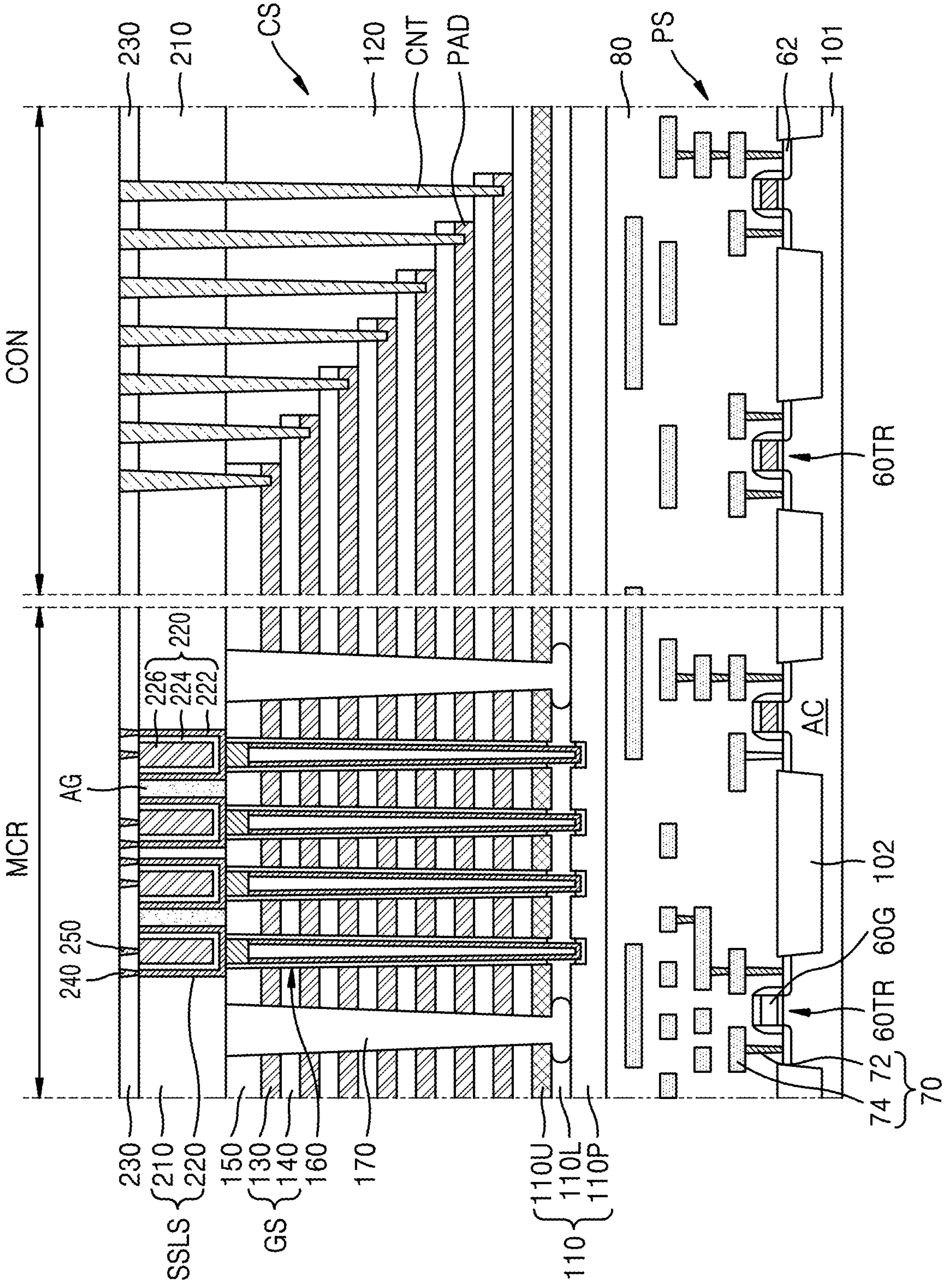
FIGS. 14 and 15 are cross-sectional views of IC devices according to embodiments.
Figure 15:
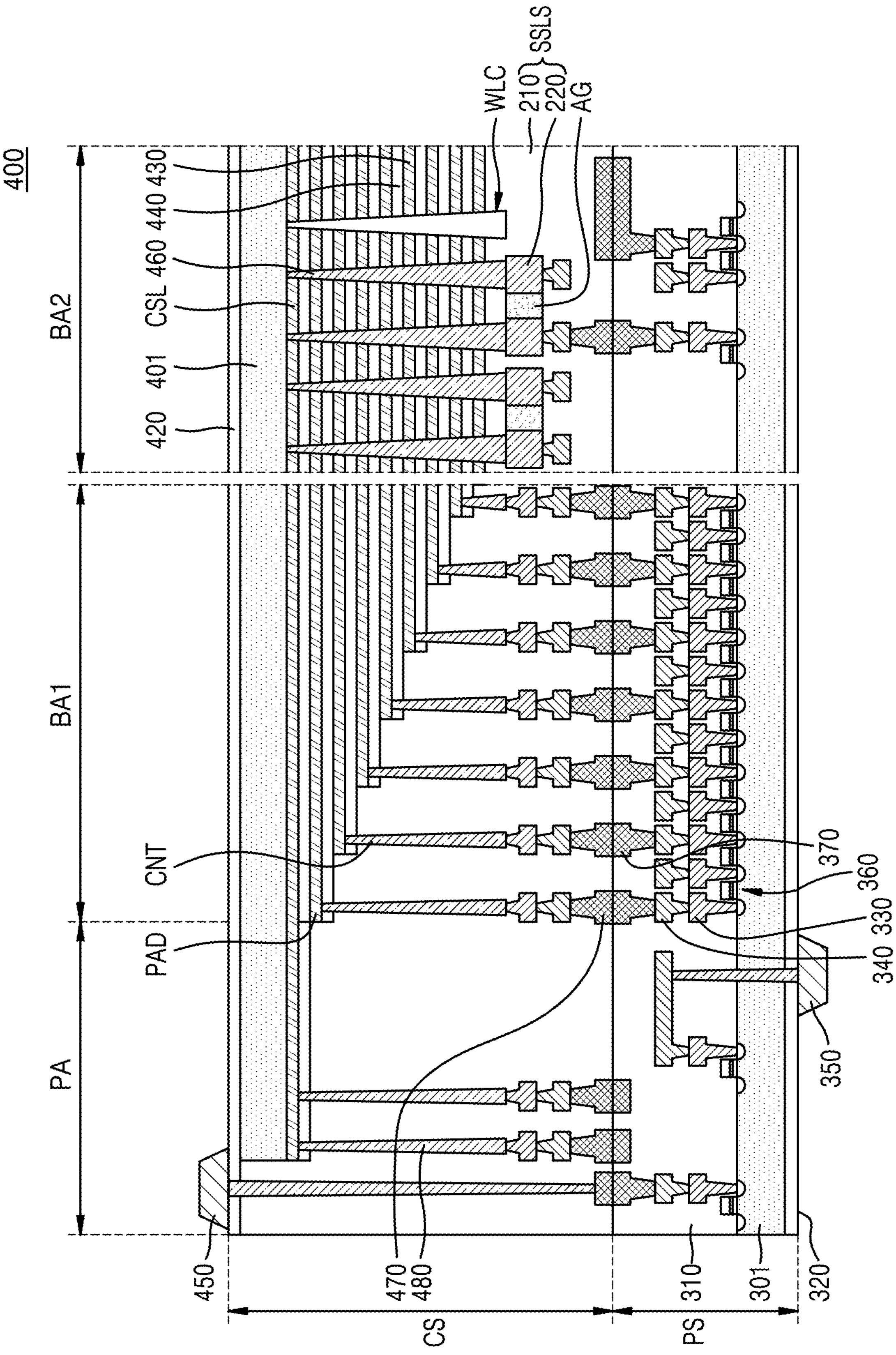

FIGS. 14 and 15 are cross-sectional views of IC devices according to embodiments.

Most of the components included in IC devices 300 and 400 described below and materials included in the components are substantially the same as or similar to those described above with reference to FIGS. 4 to 7. Thus, for brevity, descriptions focus on differences between the IC devices 300 and 400 and the IC device 100 described above.

Referring to FIG. 14, an IC device 300 may include a peripheral circuit structure PS and a memory cell array structure CS located at a higher vertical level than the peripheral circuit structure PS.

The IC device 300 according to the present embodiment may have a Cell on Periphery (COP) structure in which the memory cell array structure CS is on the peripheral circuit structure PS. A base structure 110 may be between the peripheral circuit structure PS and the memory cell array structure CS. The base structure 110 may include an upper base layer 110U, a lower base layer 110L, and a plate layer 110P.

The peripheral circuit structure PS may include a peripheral circuit transistor 60TR and a peripheral circuit wiring 70 on a semiconductor substrate 101. An active region AC may be defined by a device isolation film 102 in the semiconductor substrate 101, and a plurality of peripheral circuit transistors 60TR may be formed on the active region AC. Each of the plurality of peripheral circuit transistors 60TR may include a peripheral circuit gate 60G and source/drain regions 62 in portions of the semiconductor substrate 101 on both sides of the peripheral circuit gate 60G.

The peripheral circuit wiring 70 may include a plurality of peripheral circuit contacts 72 and a plurality of peripheral circuit metal layers 74. An interlayer insulating film 80 on and at least partially covering the peripheral circuit transistor 60TR and the peripheral circuit wiring 70 may be on the semiconductor substrate 101. The plurality of peripheral circuit metal layers 74 may have a multilayered structure including a plurality of metal layers located at different vertical levels. Although the plurality of peripheral circuit metal layers 74 are illustrated as being all formed to have the same height, in another example, peripheral circuit metal layers 74 located at some levels (e.g., a top level) may be formed to have a greater height than peripheral circuit metal layer 74 located at other levels.

In the memory cell array structure CS, a memory cell region MCR may be a region in which the memory cell array MCA of the NAND-type flash memory device with the vertical channel structure, which has been described with reference to FIG. 2, is formed. In addition, a connection region CON may be a region in which a pad portion PAD configured to electrically connect the memory cell array MCA formed in the memory cell region MCR to a peripheral circuit region (not shown) is formed.

In the memory cell array structure CS, a gate stack GS including a plurality of gate layers 130 and a plurality of insulating layers 140, which are alternately stacked on the semiconductor substrate 101, may be located. Furthermore, in the memory cell array structure CS, a plurality of channel structures 160 may extend to pass through the gate stack GS in a vertical direction, and a word line cut 170 may extend to pass through the gate stack GS in the vertical direction.

In the connection region CON, a gate layer 130 may extend to form the pad portion PAD at an end of the gate layer 130, and a cover insulating layer 120 may be on and at least partially cover the pad portion PAD. In the connection region CON, the plurality of gate layers 130 may extend to a smaller length in a first lateral direction (X direction) as the plurality of gate layers 130 get farther from a top surface of the semiconductor substrate 101 in a vertical direction (Z direction). That is, in the connection region CON, the plurality of gate layers 130 may have a staircase-type structure. In some embodiments, a first upper insulating layer 210 may be on the cover insulating layer 120.

In the connection region CON, a contact plug CNT may extend or pass through the cover insulating layer 120 and be connected to the pad portion PAD of the gate layer 130. The contact plug CNT may have a tapered column shape of which a width narrows from an upper region of the contact plug CNT to a lower region thereof in the vertical direction (Z direction).

In some embodiments, the plurality of channel structures 160 may extend or pass through the upper base layer 110U and the lower base layer 110L and contact the plate layer 110P. A portion of the first gate dielectric layer 162 may be removed at the same vertical level as the lower base layer 110L, and thus, the first channel layer 164 may be in contact with an extension of the lower base layer 110L. That is, a sidewall and a bottom portion of the first gate dielectric layer 162 may be apart from each other with the extension of the lower base layer 110L therebetween in the vertical direction (Z direction). Also, the bottom portion of the first gate dielectric layer 162 may border and at least partially surround a bottom surface of the first channel layer 164.

The IC device 300 according to the present embodiment may include a string selection line stack SSLS on the gate stack GS. In addition, the IC device 300 may include a plurality of gate structures 220, which extend or pass through the string selection line stack SSLS in the vertical direction and completely overlap the plurality of channel structures 160 corresponding thereto in the vertical direction, i.e., Z direction. Characteristically, in the string selection line stack SSLS of the IC device 300, an air gap AG may be between adjacent ones of the plurality of gate structures 220.

Referring to FIG. 15, an IC device 400 may include a chip-to-chip bonding structure.

The IC device 400 according to the present embodiment may include a chip-to-chip bonding structure in which an upper chip including the memory cell array structure CS and a lower chip including the peripheral circuit structure PS are manufactured and then connected to each other by using a bonding technique.

In some embodiments, the bonding technique may refer to a method of bringing a first bonding pad formed at an uppermost portion of the lower chip located at a lower side and a second bonding pad formed at a lowermost portion of the upper chip located at an upper side into contact with each other. The bonding technique may include a metal-metal bonding process, a through-silicon vias (TSVs), back via stacks (BVSs), a eutectic bonding process, a ball grid array (BGA) bonding process, a plurality of wiring lines, or a combination thereof.

The peripheral circuit structure PS may include a first substrate 301, an interlayer insulating layer 310, a plurality of circuit elements 360, a first metal layer 330 connected to each of the plurality of circuit elements 360, and a second metal layer 340 formed on the first metal layer 330. The interlayer insulating layer 310 may include an insulating material and be on the first substrate 301 to be on and at least partially cover the plurality of circuit elements 360, the first metal layer 330, and the second metal layer 340.

A lower bonding pad may be formed on the second metal layer 340 of a word line bonding area BA1. In the word line bonding area BA1, a first bonding pad 370 of the peripheral circuit structure PS may be electrically connected to a second bonding pad 470 of the memory cell array structure CS by using a bonding technique.

The memory cell array structure CS may provide at least one memory block. The memory cell array structure CS may include a second substrate 401 and a common source line CSL. A plurality of word lines 430 and a plurality of insulating layers 440 may be stacked on the second substrate 401 in the vertical direction (Z direction). Also, a string selection line stack SSLS may be on the second substrate 401.

In a bit line bonding area BA2, a first channel structure 460 may extend or pass through the plurality of word lines 430, the plurality of insulating layers 440, and a ground selection line in the vertical direction (Z direction). In the string selection line stack SSLS, a plurality of gate structures 220 may extend or pass through the first upper insulating layer 210.

In the IC device 400 according to the present embodiment, the string selection line stack SSLS may be under the plurality of word lines 430, based on the drawing. In addition, a plurality of gate structures 220 may completely overlap a plurality of first channel structures 460 in the vertical direction, i.e., Z direction, and an air gap AG may be between two adjacent ones of the plurality of gate structures 220.

In the word line bonding area BA1, the plurality of word lines 430 may extend parallel to a top surface of the second substrate 401 and be connected to a plurality of the contact plugs CNT. The plurality of word lines 430 may be connected to the plurality of contact plugs CNT in the pad portion PAD provided by extending at least some of the plurality of word lines 430 to different lengths.

A common source line contact 480 may be in an outer pad bonding area PA. The common source line contact 480 may include a conductive material (e.g., a metal, a metal compound, or polysilicon) and be electrically connected to the common source line CSL.

Moreover, a first I/O pad 350 and a second I/O pad 450 may be in the outer pad bonding area PA. A lower film 320 on and at least partially covering a bottom surface of the first substrate 301 may be formed under the first substrate 301, and the first I/O pad 350 may be formed on the lower film 320. An upper film 420 on and at least partially covering the top surface of the second substrate 401 may be formed on the second substrate 401, and the second I/O pad 450 may be on the upper film 420.

FIGS. 16 to 23 are cross-sectional views of a process sequence of a method of manufacturing an IC device, according to embodiments.

Figure 16:
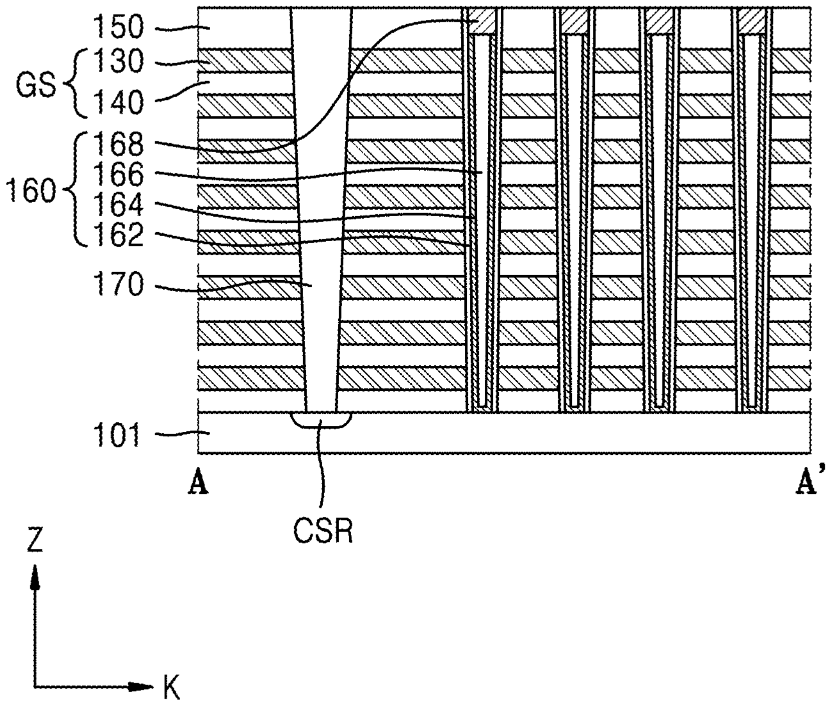
FIGS. 16 to 23 are cross-sectional views of a process sequence of a method of manufacturing an IC device, according to embodiments.

Referring to FIG. 16, a gate stack GS may be formed on a semiconductor substrate 101. Next, a plurality of channel holes 160H may be formed by removing a portion of the gate stack GS. Thereafter, a plurality of channel structures 160 may be formed inside the plurality of channel holes 160H. A portion of the gate stack GS may be removed from the resultant structure, and thus, a word line opening (not shown) may be formed. A plurality of mold layers (not shown) exposed by a sidewall of the word line opening may be removed, and portions from which the plurality of mold layers are removed may be at least partially filled by a conductive material to form a plurality of gate layers 130. That is, a replacement process of forming the plurality of gate layers 130 by replacing the plurality of mold layers by the conductive material may be performed. A word line cut 170 may be formed by at least partially filling the word line opening by an insulating material.

Figure 17:
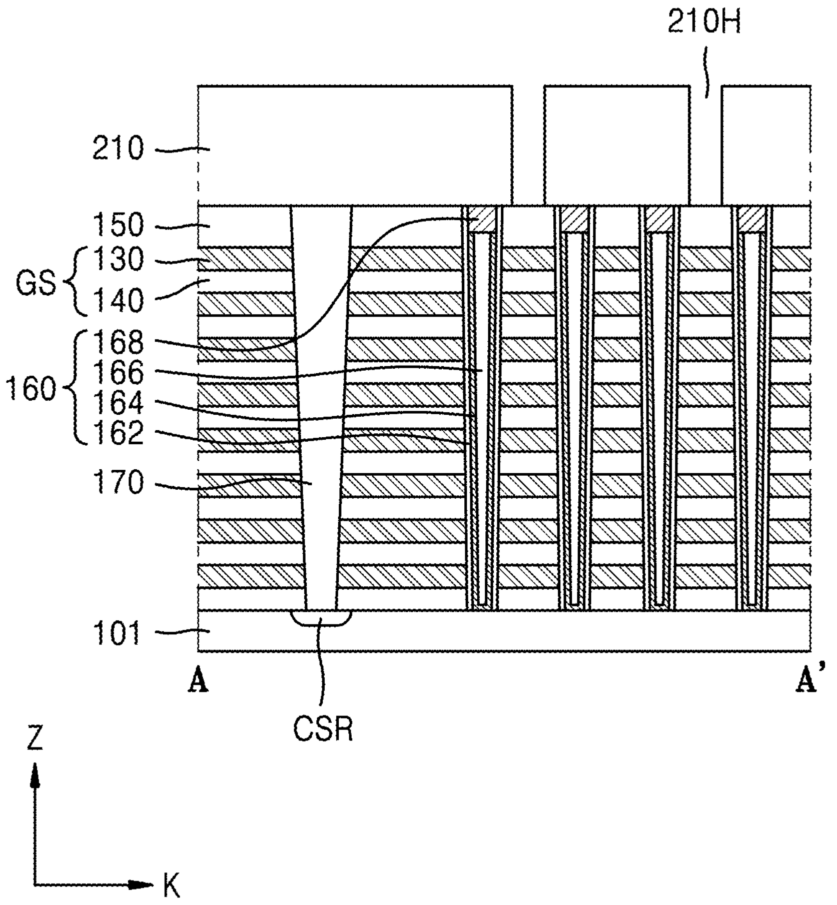

Referring to FIG. 17, a first upper insulating layer 210 having a plurality of openings 210H may be formed on a top surface of the gate stack GS. In some embodiments, the plurality of openings 210H may be formed by using a photolithography process and an etching process. The plurality of openings 210H may correspond to portions in which air gaps (refer to AG in FIG. 23) described below are located.

Figure 18:
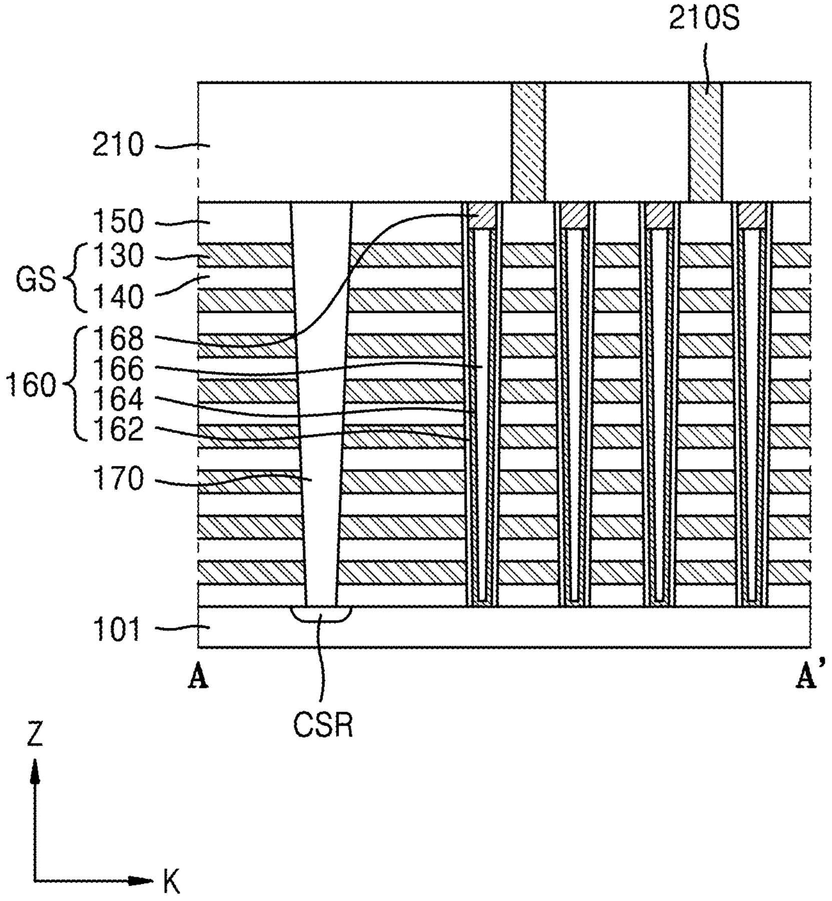

Referring to FIG. 18, a plurality of sacrificial films 210S may be formed to at least partially fill the inside of the plurality of openings 210H. The plurality of sacrificial films 210S may include a material having an etch selectivity with respect to the first upper insulating layer 210 and a gate structure (refer to 220 in FIG. 21) to be described below.

Figure 19:
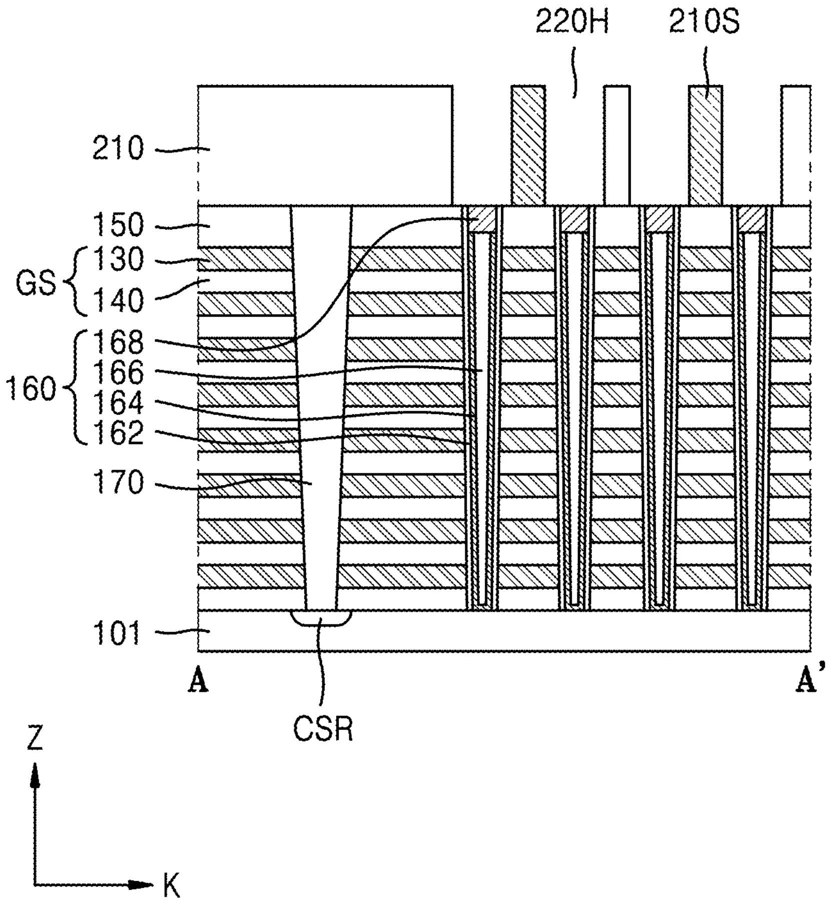

Referring to FIG. 19, a plurality of gate holes 220H may be formed in the first upper insulating layer 210. In some embodiments, the plurality of gate holes 220H may be formed by using a photolithography process and an etching process. The plurality of gate holes 220H may correspond to portions in which gate structures (refer to 220 in FIG. 21) described below are located.

Figure 20:
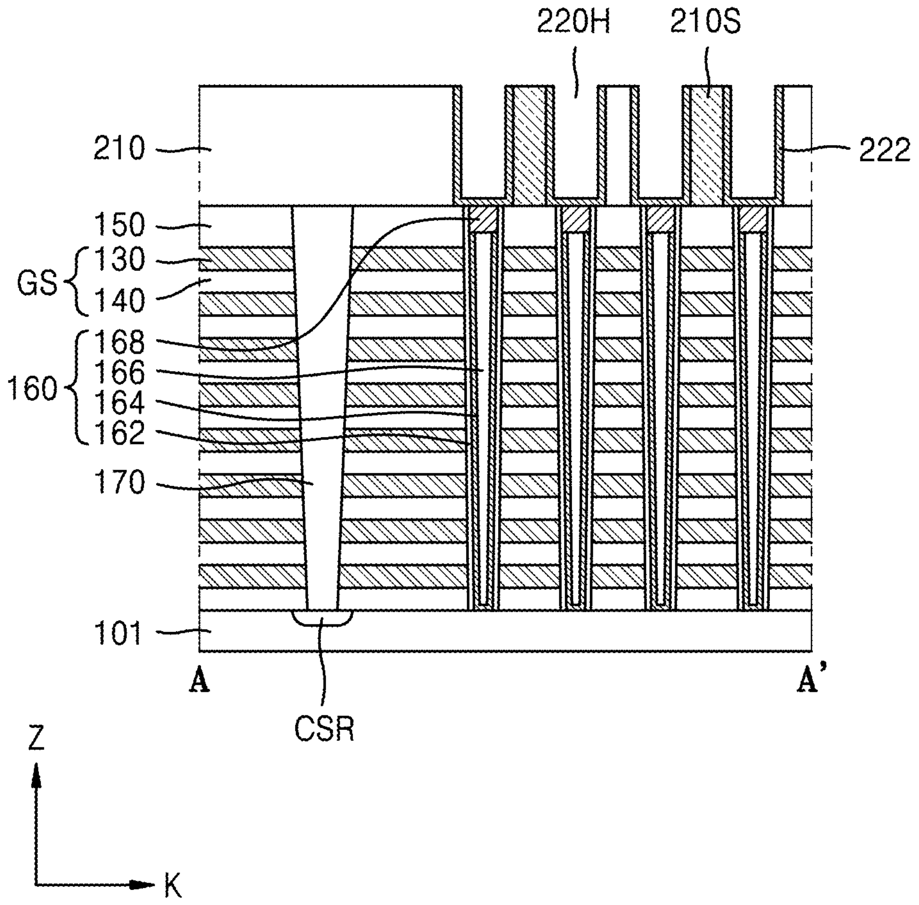

Referring to FIG. 20, a second channel layer 222 may be conformally formed along inner walls of the plurality of gate holes 220H. A lateral width of a bottom surface of the second channel layer 222 may be greater than a lateral width of an uppermost surface of the channel structure 160 corresponding thereto.

Figure 21:
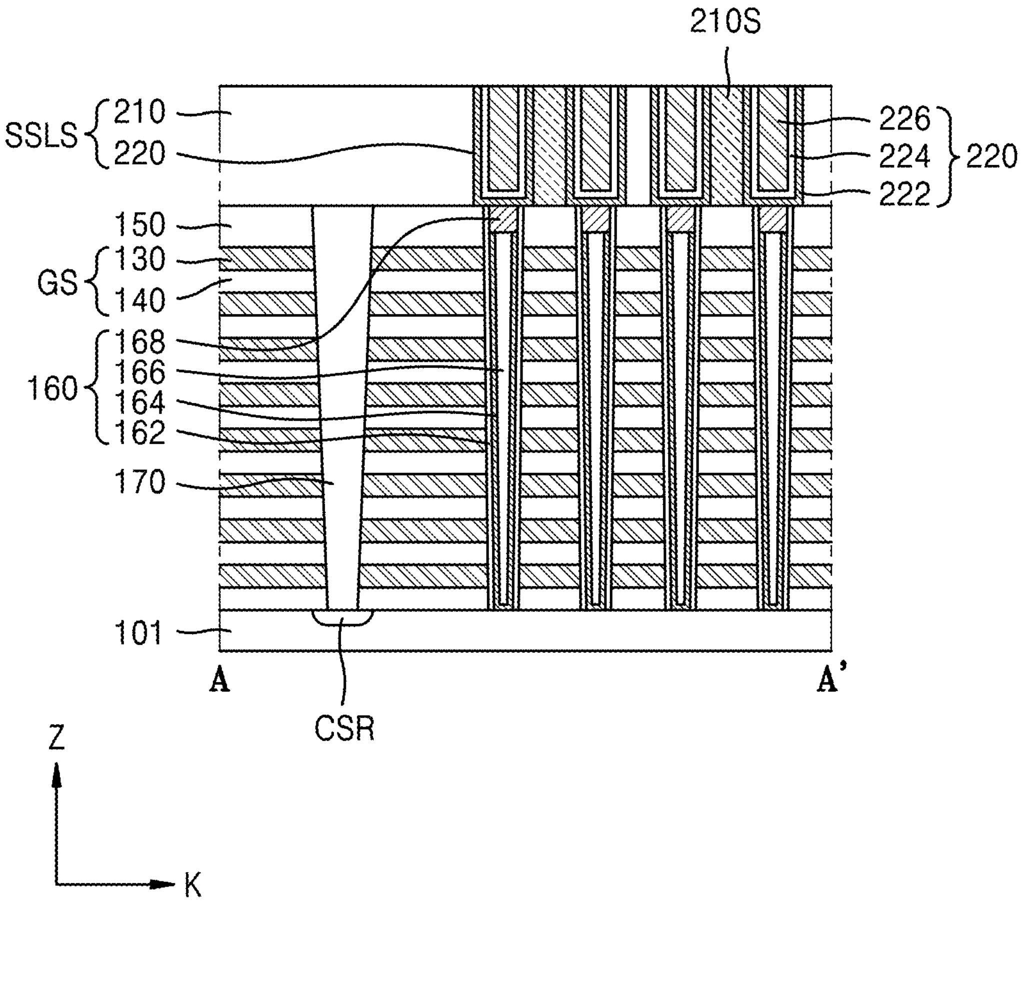

Referring to FIG. 21, a second gate dielectric layer 224 may be conformally formed on a sidewall and a bottom surface of the second channel layer 222. Next, a core gate layer 226 at least partially filling a remaining space of the gate hole (refer to 220H in FIG. 20) may be formed on the second gate dielectric layer 224. Accordingly, a plurality of gate structures 220 may be formed.

Figure 22:
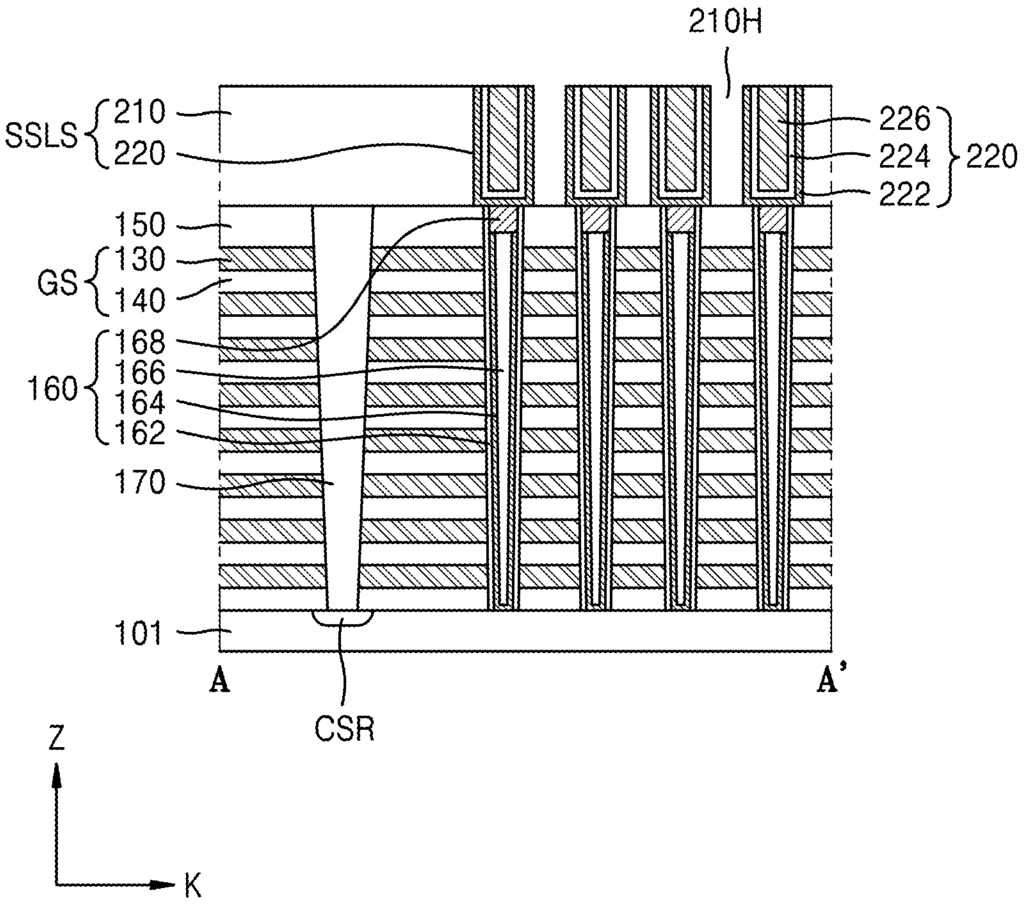

Referring to FIG. 22, an etching process of removing a plurality of sacrificial films (refer to 210S in FIG. 21) may be performed to expose a top surface of a top insulating layer 150. Only a material included in the plurality of sacrificial films (refer to 210S in FIG. 21) may be selectively removed by using the etching process. Thus, a plurality of openings 210H may be formed in a string selection line stack SSLS.

Figure 23:
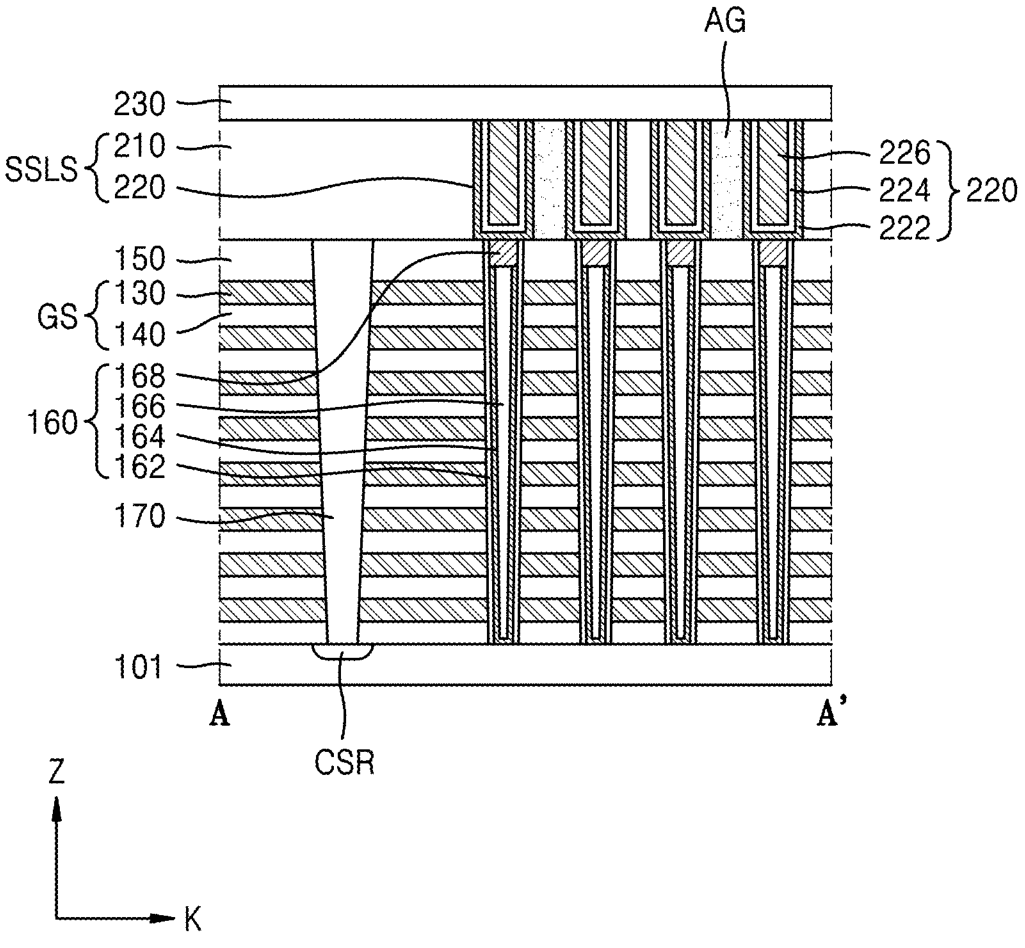

Referring to FIG. 23, a second upper insulating layer 230 may be formed to be on and at least partially cover a top portion of the string selection line stack SSLS. Accordingly, an empty space, which is bordered and at least partially surrounded by a gate stack GS, a gate structure 220, and the second upper insulating layer 230, may be formed. The empty space may constitute an air gap AG.

Referring back to FIG. 5, an upper bit line contact 240 and an upper word line contact 250 may be formed. The upper bit line contact 240 may extend or pass through the second upper insulating layer 230 and contact an uppermost surface of the second channel layer 222 in a vertical direction. The upper word line contact 250 may extend or pass through the second upper insulating layer 230 and contact an uppermost surface of the core gate layer 226 in the vertical direction.

The IC device 100 according to embodiments of the inventive concept, which is manufactured by using the manufacturing method described above, may have an effect of efficiently improving process margins during the formation of contacts, while forming the gate structure 220 functioning as a string selection line by simplifying a manufacturing process.

Figure 24:
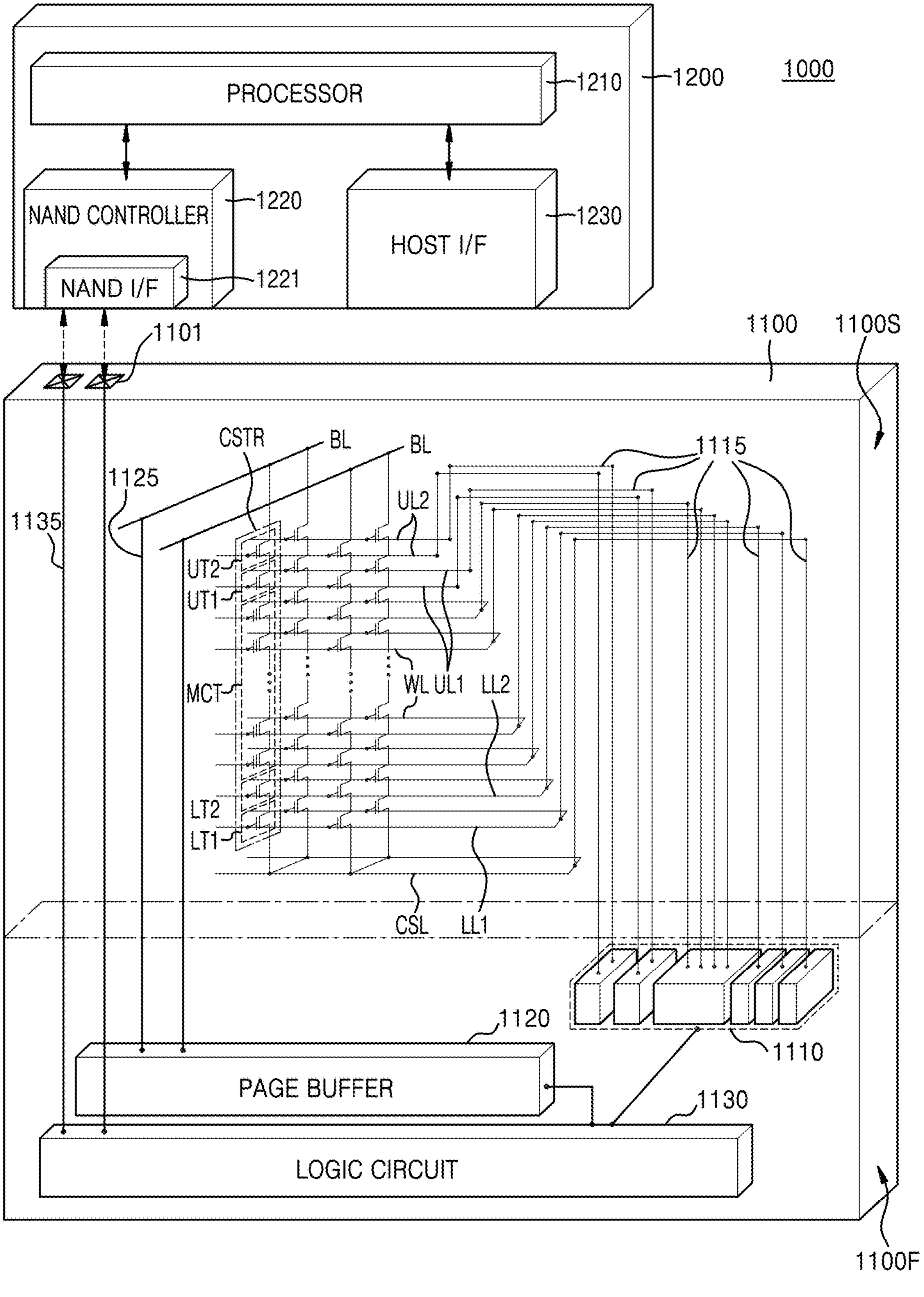
FIG. 24 is a diagram of an electronic system including an IC device according to embodiments.

FIG. 24 is a diagram of an electronic system including an IC device according to embodiments.

Referring to FIG. 24, an electronic system 1000 according to the inventive concept may include an IC device 1100 and a controller 1200 electrically connected to the IC device 1100.

The electronic system 1000 may be a storage device including at least one IC device 1100 or an electronic device including the storage device. For example, the electronic system 1000 may include a solid-state drive (SSD) device, a universal serial bus (USB), a computing system, a medical device, or a communication device, which includes the at least one IC device 1100.

The IC device 1100 may be a non-volatile vertical memory device. For example, the IC device 1100 may include a NAND flash memory device including at least one of the IC devices 100, 200, 300, and 400, which have been described with reference to FIGS. 4 to 15. The IC device 1100 may include a first structure 1100F and a second structure 1100S on the first structure 1100F. In some embodiments, the first structure 1100F may be beside the second structure 1100S.

The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors (e.g., LT1 and LT2) and the number of upper transistors (e.g., UT1 and UT2) may be variously changed according to different embodiments.

In some embodiments, the upper transistors UT1 and UT2 may include a string selection transistor and the lower transistors LT1 and LT2 may include a ground selection transistor. The first and second gate lower lines LL1 and LL2 may be respectively gate layers of the lower transistors LT1 and LT2. The word line WL may be a gate layer of the memory cell transistor MCT, and the first and second gate upper lines UL1 and UL2 may be gate layers of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connecting wires 1115, which extend from the inside of the first structure 1100F to the second structure 1100S. The plurality of bit lines BL may be electrically connected to the page buffer 1120 through a plurality of second connecting wirings 1125, which extend from the inside of the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The IC device 1100 may communicate with the controller 1200 through an I/O pad 1101 that is electrically connected to the logic circuit 1130. The I/O pad 1101 may be electrically connected to the logic circuit 1130 through I/O connection wirings 1135, which extend from the inside of the first structure 1100F to the second structure 1100S.

The controller 1200 may include a processor 1210, a NAND controller 1220, and a host interface (or host I/F) 1230. In some embodiments, the electronic system 1000 may include a plurality of IC devices 1100. In this case, the controller 1200 may control the plurality of IC devices 1100.

The processor 1210 may control all operations of the electronic system 1000 including the controller 1200. The processor 1210 may operate according to predetermined firmware and may access the IC device 1100 by controlling the NAND controller 1220. The NAND controller 1220 may include a NAND interface (or NAND I/F) 1221 configured to process communication with the IC device 1100. A control command for controlling the IC device 1100, data to be written to the plurality of memory cell transistors MCT of the IC device 1100, and data to be read from the plurality of memory cell transistors MCT of the IC device 1100 may be transmitted through the NAND interface 1221. The host interface 1230 may provide a communication function between the electronic system 1000 and an external host. When receiving the control command from the external host through the host interface 1230, the processor 1210 may control the IC device 1100 in response to the control command.

Figure 25:
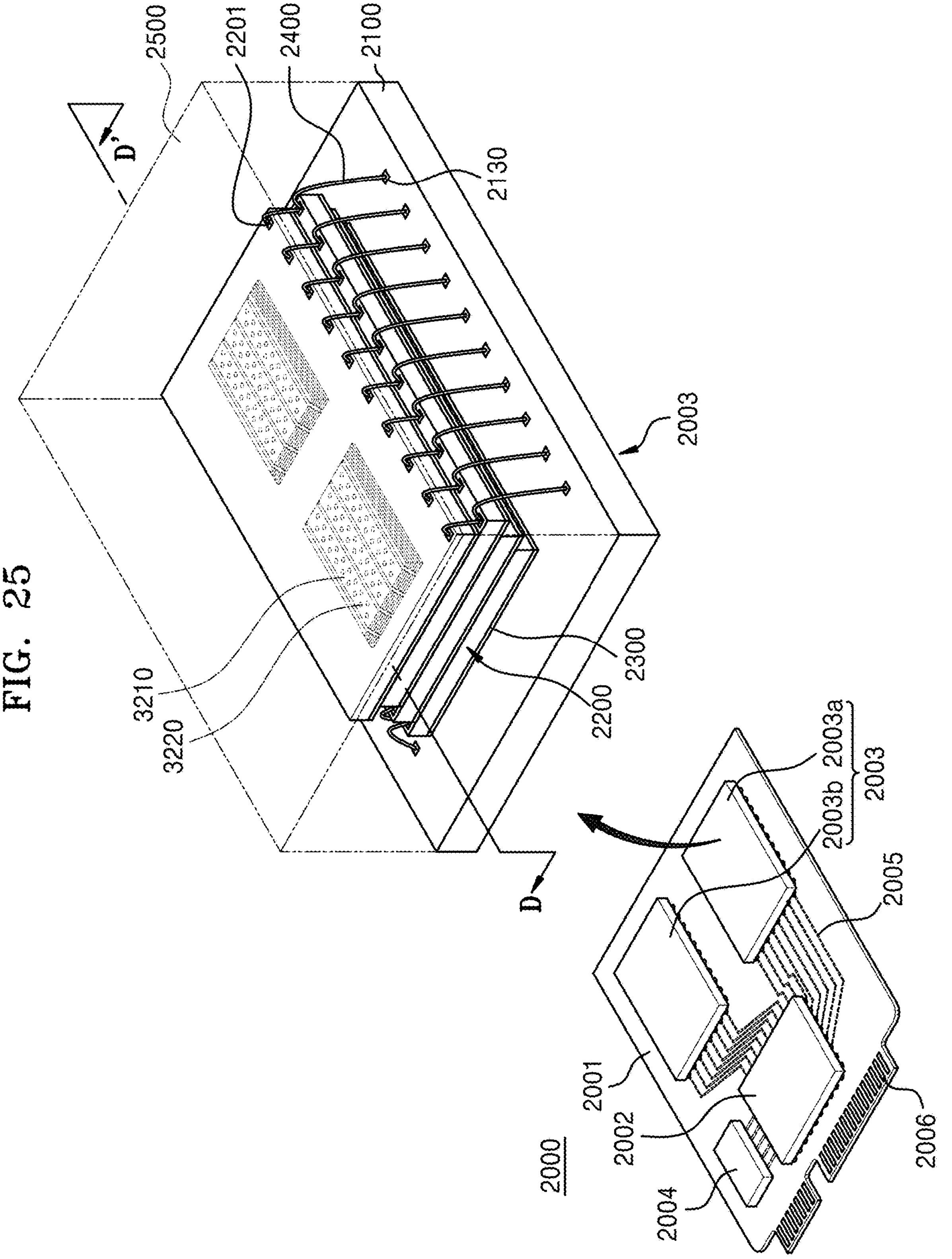
FIG. 25 is a perspective view of an electronic system including an IC device, according to embodiments.

FIG. 25 is a perspective view of an electronic system including an IC device, according to embodiments.

Referring to FIG. 25, an electronic system 2000 according to the embodiments may include a main substrate 2001, a controller 2002 mounted on the main substrate 2001, at least one semiconductor package 2003, and dynamic random-access memory (DRAM) 2004.

The main substrate 2001 may include a connector 2006 including a plurality of pins that are combined with an external host. In the connector 2006, the number and arrangement of pins may depend on a communication interface between the electronic system 2000 and the external host. In some embodiments, the electronic system 2000 may communicate with the external host by using any one of interfaces, such as a USB, peripheral component interconnect-express (PCI-E), serial advanced technology attachment (SATA), and M-Phy for universal flash storage (UFS). In some embodiments, the electronic system 2000 may operate by power received from the external host through the connector 2006. The electronic system 2000 may further include a power management integrated circuit (PMIC) configured to divide power supplied from the external host into the controller 2002 and the at least one semiconductor package 2003. The at least one semiconductor package 2003 and the DRAM 2004 may be connected to the controller 2002 by a plurality of wiring patterns 2005 formed in the main substrate 2001.

The controller 2002 may write data to the at least one semiconductor package 2003 or read data from the at least one semiconductor package 2003 and improve an operating speed of the electronic system 2000.

The DRAM 2004 may be a buffer memory configured to reduce a speed difference between the at least one semiconductor package 2003, which is a data storage space, and the external host. The DRAM 2004 included in the electronic system 2000 may operate as a kind of cache memory and provide a space for temporarily storing data in a control operation on the at least one semiconductor package 2003. When the electronic system 2000 includes the DRAM 2004, the controller 2002 may further include a DRAM controller configured to control the DRAM 2004 in addition to a NAND controller configured to control the semiconductor package 2003.

The at least one semiconductor package 2003 may include first and second semiconductor packages **2003*a* and 2003*b* that are apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the plurality of semiconductor chips 2200 on the substrate 2100, an adhesive layer 2300 on a bottom surface of each of the plurality of semiconductor chips 2200, a connection structure 2400 configured to electrically connect the plurality of semiconductor chips 2200 to the package substrate 2100, and a molding layer 2500 covering the plurality of semiconductor chips 2200 and the connection structure 2400 on the package substrate 2100**.

The package substrate 2100 may be a printed circuit board (PCB) including a plurality of package upper pads 2130. Each of the plurality of semiconductor chips 2200 may include an I/O pad 2201. The I/O pad 2201 may correspond to the I/O pad 1101 of FIG. 24. Each of the plurality of semiconductor chips 2200 may include a plurality of gate stacks 3210 and a plurality of channel structures 3220. Each of the plurality of semiconductor chips 2200 may include at least one of the IC devices 100, 200, 300, and 400 that have been described with reference to FIGS. 4 to 15.

In some embodiments, the connection structure 2400 may include a bonding wire configured to electrically connect the I/O pad 2201 to the package upper pad 2130. Accordingly, in the first and second semiconductor packages **2003*a* and 2003*b*, the plurality of semiconductor chips 2200 may be electrically connected to each other by using a bonding wire technique and may be electrically connected to the package upper pad 2130 of the package substrate 2100. In some embodiments, in the first and second semiconductor packages 2003*a* and 2003*b*, the plurality of semiconductor chips 2200 may be electrically connected to each other by a connection structure including TSVs instead of the connection structure 2400** for a bonding wire technique.

In some embodiments, the controller 2002 and the plurality of semiconductor chips 2200 may be included in one package. In some embodiments, the controller 2002 and the plurality of semiconductor chips 2200 may be mounted on an additional interposer substrate, which is different from the main substrate 2001, and the controller 2002 may be connected to the plurality of semiconductor chips 2200 by wirings formed on the interposer substrate.

Figure 26:
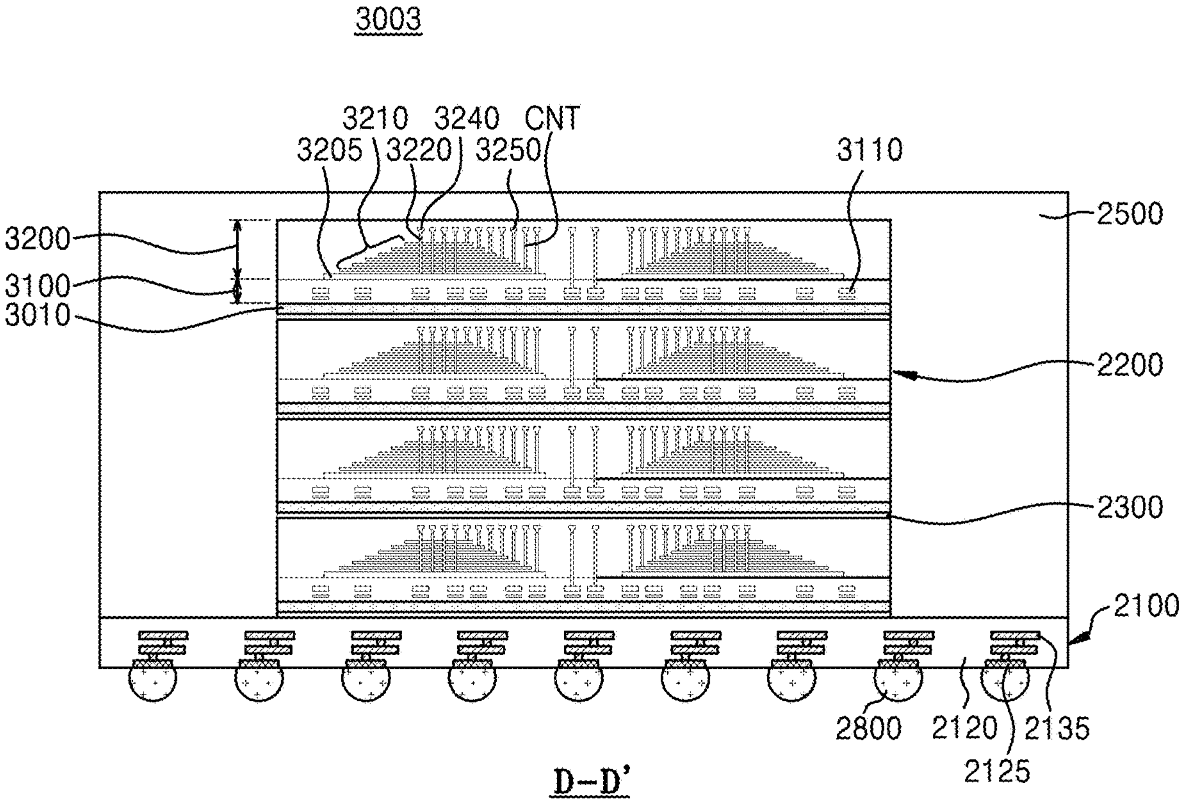
FIGS. 26 and 27 are cross-sectional views of semiconductor packages including IC devices, according to embodiments.
Figure 27:
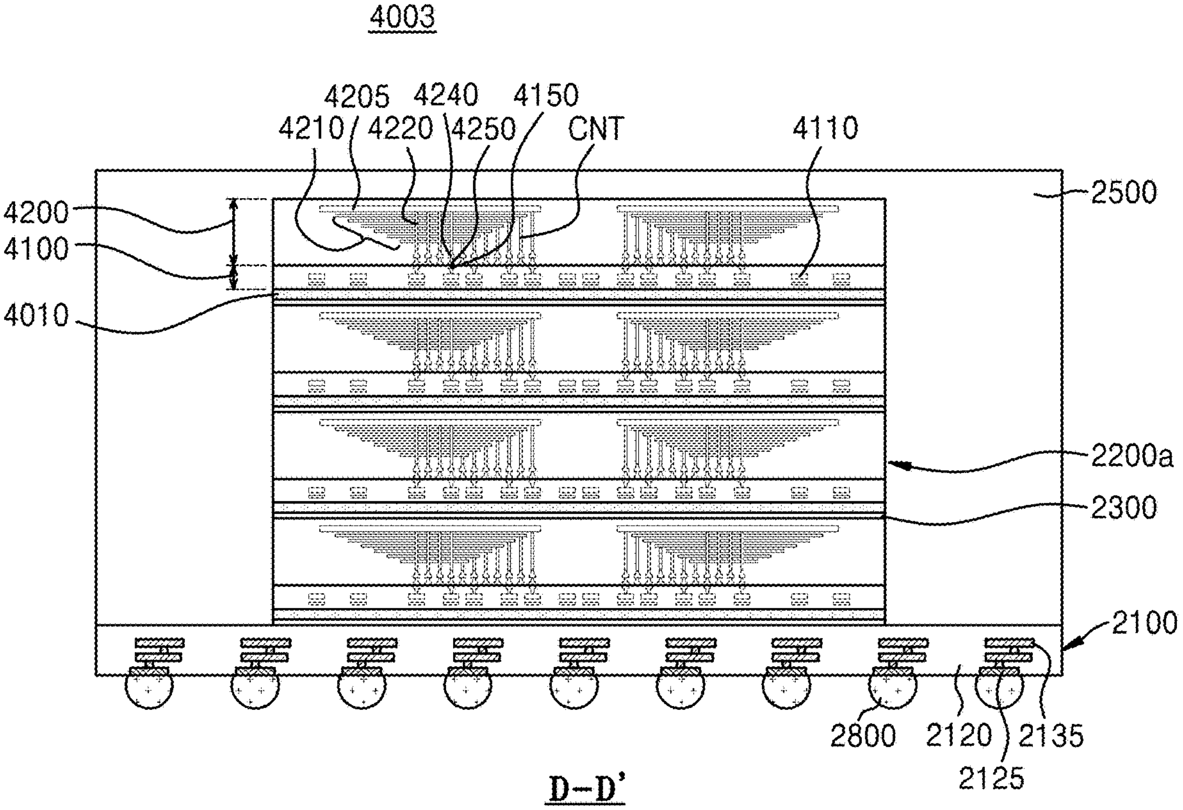

FIGS. 26 and 27 are cross-sectional views of semiconductor packages including IC devices, according to embodiments.

Specifically, FIGS. 26 and 27 illustrate detailed configurations corresponding to cross-sections taken along line D-D' of FIG. 25.

Referring to FIG. 26, in a semiconductor package 2003, a package substrate 2100 may include a PCB.

The package substrate 2100 may include a body portion 2120, a plurality of package upper pads (refer to 2130 in FIG. 25) on a top surface of the body portion 2120, a plurality of lower pads 2125 on a bottom surface of the body portion 2120 or exposed through the bottom surface thereof, and a plurality of internal wirings 2135 configured to electrically connect the plurality of upper pads 2130 to the plurality of lower pads 2125 in the body portion 2120. The plurality of upper pads 2130 may be electrically connected to a plurality of connection structures (refer to 2400 in FIG. 25). The plurality of lower pads 2125 may be connected to a plurality of wiring patterns 2005 on a main substrate 2001 of the electronic system 2000 shown in FIG. 25, through a plurality of conductive connectors 2800.

Each of a plurality of semiconductor chips 2200 may include a semiconductor substrate 3010 and a first structure 3100 and a second structure 3200, which are sequentially stacked on the semiconductor substrate 3010. The first structure 3100 may include a peripheral circuit region including a plurality of peripheral wirings 3110. The second structure 3200 may include a common source line 3205, a gate stack 3210 on the common source line 3205, a channel structure 3220 extending or passing through the gate stack 3210, and a bit line 3240 electrically connected to the channel structure 3220.

Each of the plurality of semiconductor chips 2200 may include through wirings 3250, which are electrically connected to the plurality of peripheral wirings 3110 of the first structure 3100 and extend into the second structure 3200. The through wiring 3250 may be outside the gate stack 3210. In other embodiments, the semiconductor package 3003 may further include a through wiring that extends or passes through the gate stack 3210. Each of the plurality of semiconductor chips 2200 may further include I/O pads (refer to 2201 in FIG. 25), which is electrically connected to the plurality of peripheral wirings 3110 of the first structure 3100.

Referring to FIG. 27, a semiconductor package 4003 may have a configuration similar to that of the semiconductor package 3003 described with reference to FIG. 26. However, the semiconductor package 4003 may include a plurality of semiconductor chips 2200*a*.

Each of the plurality of semiconductor chips 2200*a* may include a semiconductor substrate 4010, a first structure 4100 on the semiconductor substrate 4010, and a second structure 4200 bonded to the first structure 4100 by using a wafer bonding technique on the first structure 4100. The first structure 4100 may include a peripheral circuit region including a peripheral wiring 4110 and a plurality of first junction structures 4150. The second structure 4200 may include a common source line 4205, a gate stack 4210 between the common source line 4205 and the first structure 4100, and a channel structure 4220 extending or passing through the gate stack 4210.

In addition, each of the plurality of semiconductor chips 2200*a* may include a plurality of second junction structures 4250, which are respectively connected to a plurality of gate layers 130 of the gate stack 4210. For example, some of the plurality of second junction structures 4250 may be connected to a bit line 4240 that is electrically connected to the channel structure 4220. Some others of the plurality of second junction structures 4250 may be electrically connected to the gate layer 130 through a plurality of contact plugs CNT.

A plurality of first junction structures 4150 of the first structure 4100 and a plurality of second junction structures 4250 of the second structure 4200 may be bonded to each other while contacting each other. Portions where the plurality of first junction structures 4150 are bonded to the plurality of second junction structures 4250 may include a metal (e.g., copper (Cu)), without being limited thereto.

While embodiments of the inventive concept has been particularly shown and described with reference to embodiments thereof, it will be understood that various changes in form and details may be made therein without departing from the spirit and scope of the following claims.

What is claimed is:

1. An integrated circuit device comprising:

a semiconductor substrate;

a gate stack comprising a plurality of gate layers and a plurality of insulating layers, the plurality of gate layers and the plurality of insulating layers being alternately stacked on the semiconductor substrate;

a plurality of channel structures extending through the gate stack in a first direction;

a word line cut extending through the gate stack in the first direction;

a string selection line stack on the gate stack; and a plurality of gate structures extending through the string selection line stack in the first direction, the plurality of gate structures completely overlapping the plurality of channel structures corresponding thereto in the first direction, wherein an air gap is between two gate structures, which are adjacent to each other in an oblique direction relative to the first direction, from among the plurality of gate structures.

2. The integrated circuit device of claim 1, wherein the two adjacent gate structures are symmetrically arranged about the air gap.

3. The integrated circuit device of claim 1, wherein each of the plurality of channel structures comprises:

a channel hole;

a first gate dielectric layer and a first channel layer stacked on a sidewall of the channel hole;

a buried insulating layer in a remaining space of the channel hole; and a conductive plug configured to block an entrance of the channel hole, and wherein each of the plurality of gate structures comprises:

a gate hole;

a second channel layer and a second gate dielectric layer stacked on a sidewall of the gate hole; and a core gate layer in a remaining space of the gate hole.

4. The integrated circuit device of claim 3, wherein the air gap is in contact with the second channel layer of each of the two adjacent gate structures.

5. The integrated circuit device of claim 3, wherein all sidewalls and a bottom surface of the core gate layer are bordered by the second channel layer.

6. The integrated circuit device of claim 3, wherein each of the plurality of gate structures comprises:

an upper bit line contact in contact with an uppermost surface of the second channel layer in the first direction; and an upper word line contact in contact with an uppermost surface of the core gate layer in the first direction.

7. The integrated circuit device of claim 3, wherein a first lateral width in the oblique direction of the channel hole of each of the plurality of channel structures is less than a second lateral width in the oblique direction of the second channel layer of each of the plurality of gate structures.

8. The integrated circuit device of claim 3, wherein, in each of the plurality of gate structures, an uppermost surface of the second channel layer, an uppermost surface of the second gate dielectric layer, and an uppermost surface of the core gate layer are coplanar with each other.

9. The integrated circuit device of claim 1, wherein, in a plan view, at least one sidewall of each of the plurality of gate structures has a rounded shape.

10. The integrated circuit device of claim 1, wherein the two adjacent gate structures share one air gap therebetween.

11. An integrated circuit device comprising:

a semiconductor substrate;

a gate stack comprising a plurality of gate layers and a plurality of insulating layers, the plurality of gate layers and the plurality of insulating layers being alternately stacked on the semiconductor substrate;

a plurality of channel structures extending through the gate stack in a first direction;

a word line cut extending through the gate stack in the first direction;

a string selection line stack on the gate stack; and a plurality of gate structures extending through the string selection line stack in the first direction, the plurality of gate structures completely overlapping the plurality of channel structures corresponding thereto in the first direction, wherein each of the plurality of gate structures comprises a gate hole, a channel layer, a gate dielectric layer, and a core gate layer, the channel layer and the gate dielectric layer being stacked on a sidewall of the gate hole, and the core gate layer being in a remaining space of the gate hole, and wherein an air gap is between respective channel layers of two gate structures, which are adjacent to each other in an oblique direction relative to the first direction, from among the plurality of gate structures.

12. The integrated circuit device of claim 11, wherein each of the plurality of channel structures comprises:

a channel hole;

a ferroelectric material layer and a vertical channel layer stacked on a sidewall of the channel hole;

a buried insulating layer in a remaining space of the channel hole; and a conductive plug configured to block an entrance of the channel hole.

13. The integrated circuit device of claim 11, wherein each of the plurality of channel structures comprises:

a channel hole;

a vertical channel layer and a variable resistive material layer stacked on a sidewall of the channel hole;

a buried insulating layer in a remaining space of the channel hole; and a conductive plug configured to block an entrance of the channel hole.

14. The integrated circuit device of claim 11, wherein, in a plan view, the air gap has a rectangular shape, a square shape, a circular shape, or an elliptical shape.

15. The integrated circuit device of claim 11, wherein, in each of the plurality of gate structures, a first direction level of an uppermost surface of the channel layer, a first direction level of an uppermost surface of the gate dielectric layer, and a first direction level of an uppermost surface of the core gate layer are substantially the same as each other.

16. The integrated circuit device of claim 11, wherein, in each of the plurality of gate structures, a first direction level of an uppermost surface of the channel layer is substantially the same as a first direction level of an uppermost surface of the gate dielectric layer, and a first direction level of an uppermost surface of the core gate layer is lower than the first direction level of the uppermost surface of the channel layer where an uppermost surface of the semiconductor substrate provides a base reference level.

17. The integrated circuit device of claim 11, wherein, in each of the plurality of gate structures, a first direction level of an uppermost surface of the core gate layer is substantially the same as a first direction level of an uppermost surface of the gate dielectric layer, and a first direction level of an uppermost surface of the channel layer is lower than a first direction level of the uppermost surface of the core gate layer where an uppermost surface of the semiconductor substrate provides a base reference level.

18. The integrated circuit device of claim 11, wherein, in each of the plurality of gate structures, a first direction level of an uppermost surface of the channel layer, a first direction level of an uppermost surface of the gate dielectric layer, and a first direction level of an uppermost surface of the core gate layer are substantially the same as each other, and a first direction level of a top surface of a portion of the channel layer, which is farthest from the air gap in the oblique direction, is lower than the first direction level of the uppermost surface of the core gate layer where an uppermost surface of the semiconductor substrate provides a base reference level.

19. An electronic system comprising:

a main substrate;

an integrated circuit device on the main substrate; and a controller electrically connected to the integrated circuit device on the main substrate, wherein the integrated circuit device comprises:

a semiconductor substrate;

a gate stack comprising a plurality of gate layers and a plurality of insulating layers, the plurality of gate layers and the plurality of insulating layers being alternately stacked on the semiconductor substrate;

a plurality of channel structures extending through the gate stack in a first direction;

a word line cut extending through the gate stack in the first direction;

a string selection line stack on the gate stack; and a plurality of gate structures extending through the string selection line stack in the first direction, the plurality of gate structures completely overlapping the plurality of channel structures corresponding thereto in the first direction, wherein an air gap is between two gate structures, which are adjacent to each other in an oblique direction relative to the first direction, from among the plurality of gate structures.

20. The integrated circuit device of claim 19 wherein the main substrate further comprises wiring patterns configured to electrically connect the integrated circuit device to the controller, wherein the two adjacent gate structures are symmetrically arranged about the air gap, and wherein each of the plurality of gate structures comprises a gate hole, a channel layer, a gate dielectric layer, and a core gate layer, the channel layer and the gate dielectric layer being stacked on a sidewall of the gate hole, and the core gate layer being in a remaining space of the gate hole.

* * * * *